United States Patent
Hsu et al.

(10) Patent No.: US 12,021,099 B2
(45) Date of Patent: Jun. 25, 2024

(54) EMBEDDED LIGHT SHIELD STRUCTURE FOR CMOS IMAGE SENSOR

(71) Applicant: Taiwan Semiconductor Manufacturing Co., Ltd., Hsin-Chu (TW)

(72) Inventors: Shih-Hsun Hsu, New Taipei (TW); Ping-Hao Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 589 days.

(21) Appl. No.: 16/994,963

(22) Filed: Aug. 17, 2020

(65) Prior Publication Data

US 2021/0098519 A1    Apr. 1, 2021

Related U.S. Application Data

(60) Provisional application No. 62/908,160, filed on Sep. 30, 2019.

(51) Int. Cl.
*H01L 27/146* (2006.01)

(52) U.S. Cl.
CPC .. *H01L 27/14623* (2013.01); *H01L 27/14636* (2013.01); *H01L 27/1464* (2013.01); *H01L 27/14658* (2013.01)

(58) Field of Classification Search
CPC ........... H01L 27/14623; H01L 27/1464; H01L 27/1463; H01L 27/14643
See application file for complete search history.

(56) References Cited

U.S. PATENT DOCUMENTS

| | | | |
|---|---|---|---|
| 5,558,927 A * | 9/1996 | Aruga | G02B 5/201 428/1.31 |
| 2015/0035100 A1 | 2/2015 | Tanida | |
| 2015/0061062 A1* | 3/2015 | Lin | H01L 27/14689 438/69 |
| 2016/0013231 A1 | 1/2016 | Lee | |
| 2017/0153766 A1* | 6/2017 | Kimura | G02F 1/134363 |
| 2018/0027171 A1 | 1/2018 | Yoshimura et al. | |
| 2018/0211986 A1 | 7/2018 | Lee et al. | |
| 2019/0067357 A1 | 2/2019 | Cheng et al. | |
| 2019/0096951 A1 | 3/2019 | Cheng et al. | |

(Continued)

*Primary Examiner* — Mounir S Amer
*Assistant Examiner* — Alexander Belousov
(74) *Attorney, Agent, or Firm* — Eschweiler & Potashnik, LLC

(57) ABSTRACT

In some embodiments, an image sensor is provided. The image sensor comprises a first photodetector disposed within a front-side surface of a semiconductor substrate. A trench isolation structure is disposed over a back-side surface of the semiconductor substrate. The trench isolation structure includes a buffer layer and a dielectric liner. The buffer layer covers the back-side surface of the semiconductor substrate and fills trenches that extend downward into the back-side surface of the semiconductor substrate. The dielectric liner is disposed between the buffer layer and the semiconductor substrate. A composite grid structure has composite grid segments that are aligned over the trenches, respectively. The buffer layer separates the dielectric liner from the composite grid structure. A light shield structure is disposed within the buffer layer and directly overlies the first photodetector.

20 Claims, 12 Drawing Sheets

(56) References Cited

U.S. PATENT DOCUMENTS

| | | |
|---|---|---|
| 2019/0148431 A1 | 5/2019 | Cheng et al. |
| 2019/0215442 A1 | 7/2019 | Kim et al. |
| 2019/0221597 A1 | 7/2019 | Noh et al. |
| 2021/0335861 A1 | 10/2021 | Cheng et al. |
| 2022/0359584 A1* | 11/2022 | Hamasaki ............ G01S 17/894 |

* cited by examiner

EMBEDDED LIGHT SHIELD STRUCTURE FOR CMOS IMAGE SENSOR

This Application claims the benefit of U.S. Provisional Application No. 62/908,160, filed on Sep. 30, 2019, the contents of which are hereby incorporated by reference in their entirety.

BACKGROUND

Many modern day electronic devices (e.g., digital cameras, optical imaging devices, etc.) comprise image sensors. Image sensors convert optical images to digital data that may be represented as digital images. An image sensor includes an array of pixel sensors, which are unit devices for the conversion of an optical image into digital data. Some types of pixel sensors include charge-coupled device (CCD) image sensors and complementary metal-oxide-semiconductor (CMOS) image sensors. Compared to CCD pixel sensors, CMOS pixel sensors are favored due to low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
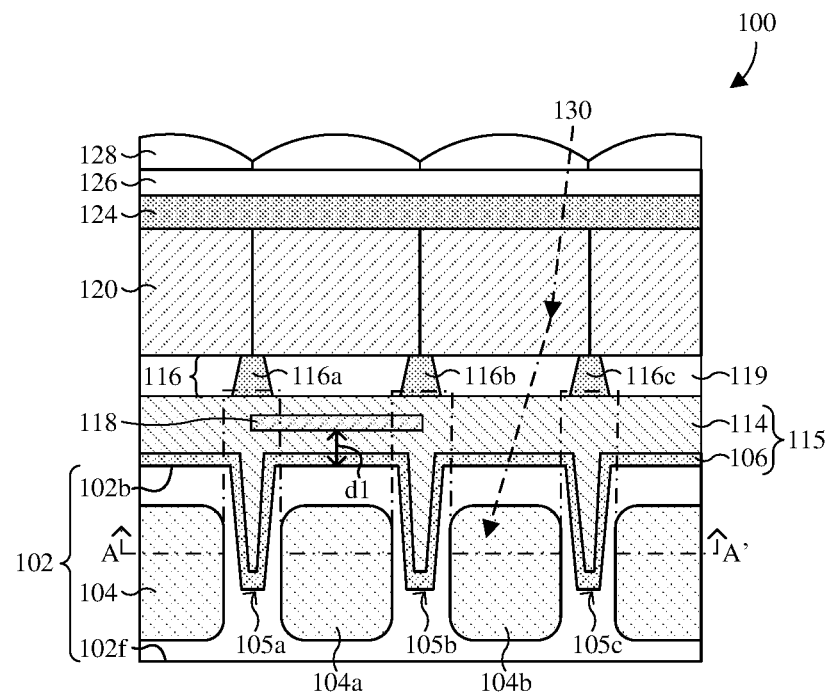
FIG. 1A illustrates a cross-sectional view of some embodiments of an image sensor comprising a buffer layer disposed over a back-side surface of a semiconductor substrate and a light shield structure disposed within the buffer layer.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some complementary metal-oxide semiconductor image sensors (CISs) include a plurality of photodetectors disposed in a semiconductor substrate. A plurality of pixel devices (e.g., transfer transistors, source follower transistors, reset transistors, etc.) and an interconnect structure are disposed along a front-side surface of the semiconductor substrate. An isolation structure (e.g., a deep trench isolation (DTI) structure) is disposed in/over a back-side surface of the semiconductor substrate and is disposed laterally between adjacent photodetectors. The isolation structure comprises a buffer layer including one or more segments extending into the semiconductor substrate and a dielectric liner disposed between the semiconductor substrate and the buffer layer. A composite grid structure overlies the buffer layer and is laterally arranged around a plurality of grid openings corresponding to the plurality of photodetectors. The composite grid structure may comprise one or more metal grid layers configured to direct incident light towards the photodetectors and increase optical isolation between the photodetectors, thereby decreasing crosstalk among the plurality of photodetectors. Further, microlenses and color filters corresponding to the photodetectors overlie the composite grid structure.

The CIS may include a light shield structure disposed over the buffer layer and along a top surface and sidewalls of the composite grid structure. The light shield structure is configured to mitigate incident light from reaching a first photodetector that directly underlies the light shield structure. This reduces a quantum efficiency (QE) of the first photodetector. Further, the light shield structure is laterally offset from a second photodetector that neighbors the first photodetector, such that incident light disposed directly over the second photodetector is not blocked by the light shield structure. This increases a QE of the second photodetector, such that the first photodetector has a lower QE than the neighboring second photodetector. By virtue of the first photodetector having the lower QE, an exposure time of the CIS may be increased. This is because the first photodetector will collect less incident light (e.g., photons) during the increased exposure time, thereby mitigating a leakage of accumulated charge from the first photodetector, through the semiconductor substrate, to the neighboring second photodetector. Further, the increased exposure time may increase a sensitivity of the CIS, which increases an ability to produce accurate images in low light environments (e.g., at night). However, a thickness of the buffer layer over the back-side surface of the semiconductor substrate may be relatively large (e.g., greater than about 50,000 angstroms), thereby increasing a distance between the light shield structure and the back-side surface of the semiconductor substrate. This increases a path for the incident light to reach the first photodetector. For example, incident light disposed at an angle relatively to a top surface of the buffer layer may traverse the distance between the light shield structure and the back-side surface of the semiconductor substrate to the first photodetector. Thus, crosstalk among the plurality of photodetectors is increased and a sensitivity of the CIS is decreased.

In various embodiments, the present application is directed towards an image sensor comprising a light shield structure disposed between a grid structure and a back-side surface of a semiconductor substrate. The image sensor comprises a plurality of photodetectors disposed within the semiconductor substrate. An isolation structure is disposed in/over the back-side surface of the semiconductor substrate and is disposed laterally between adjacent photodetectors. The isolation structure comprises a buffer layer including one or more segments extending into the semiconductor substrate and a dielectric liner disposed between the semiconductor substrate and the buffer layer. The composite grid structure overlies the buffer layer and is arrange around a plurality of grid openings corresponding to the photodetectors. The composite grid structure may comprise one or more metal grid layers configured to direct incident light towards the photodetectors. Further, the light shield structure is disposed within the buffer layer and directly overlies a first photodetector. The light shield structure is laterally offset from at least a portion of an adjacent second photodetector. The light shield structure is configured to block at least a portion of incident light from reaching the first photodetector, thereby reducing a QE of the first photodetector and mitigating blooming among the plurality of photodetectors. Thus, the QE of the first photodetector is less than a QE of the second photodetector such that a sensitivity of the image sensor is increased (e.g., increasing sensitivity during long exposure periods and/or in low light environments). By virtue of the light shield structure being disposed within the buffer layer, a distance between the light shield structure and the back-side surface of the semiconductor substrate is reduced. This, in part, maintains the relatively low QE of the first photodetector (e.g., less than the QE of the second photodetector) while increasing optical isolation between the first and second photodetectors. Therefore, the light shield structure decreases crosstalk and blooming in the plurality of photodetectors, and increases the sensitivity of the image sensor.

Figure 1B:
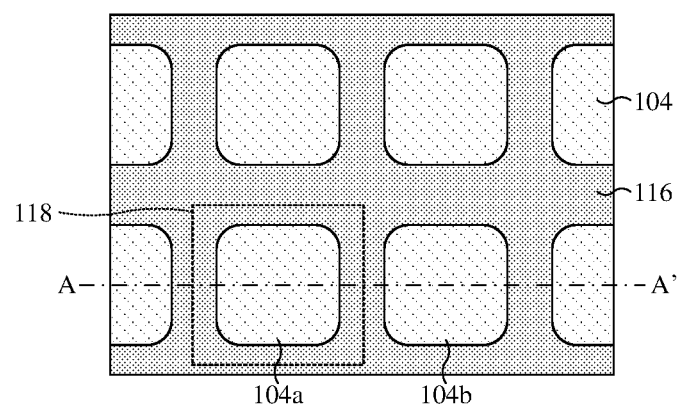
FIG. 1B illustrates a top view of some embodiments of the image sensor of FIG. 1A taken along the line A-A'.

FIGS. 1A-1B illustrate an image sensor 100 in accordance with some embodiments. FIG. 1A illustrates some embodiments of a cross-sectional view taken along line A-A' of FIG. 1B. FIG. 1B illustrates some embodiments of a top view of the image sensor 100 facing a back-side surface 102b of the semiconductor substrate 102.

As shown in FIGS. 1A-1B, the image sensor 100 comprises a plurality of photodetectors 104 disposed in a semiconductor substrate 102. The plurality of photodetectors 104 are configured to absorb incident light 130 (e.g., photons) and generate respective electrical signals corresponding to the incident light 130. In some embodiments, the semiconductor substrate 102 comprises a semiconductor body (e.g., monocrystalline silicon substrate, silicon-germanium (SiGe) substrate, silicon on insulator (SOI) substrate). A light filter array (e.g., a color filter array) having a plurality of light filters 120 (e.g., color filters) is disposed over the plurality of photodetectors 104. A plurality of microlenses 128 are typically disposed over the light filter array, such that the light filter array separates the microlenses 128 from the photodetectors 104. Typically, the microlenses 128 have a rounded upper surface, such that the microlenses 128 are configured to focus incident light 130 (e.g., photons) onto the photodetectors 104. A first interface layer 124, such as a dielectric layer, is disposed over the plurality of light filters 120. In some embodiments, an anti-reflective coating (ARC) layer 126 is disposed between the first interface layer 124 and the plurality of microlenses 128.

To absorb the incident light 130, the image sensor 100 includes the photodetectors 104 disposed between the back-side surface 102b and a front-side surface 102f of the semiconductor substrate 102. An isolation structure 115 is disposed within/over the back-side surface 102b of the semiconductor substrate 102. In some embodiments, the isolation structure 115 may be referred to as a trench isolation structure. The isolation structure 115 includes a dielectric liner 106 that lines trenches 105a, 105b, and 105c that extend downward into the back-side surface 102b of the semiconductor substrate 102. The isolation structure 115 further includes a buffer layer 114 overlying the dielectric liner 106 and filling the trenches 105a-c. A composite grid structure 116 overlies the buffer layer 114, and includes composite grid segments 116a, 116b, 116c that are aligned over the trenches 105a-c, respectively. In some embodiments, the composite grid structure 116 comprises a plurality of metal layers configured to reduce crosstalk between adjacent photodetectors 104. Further, a dielectric structure 119 overlies the buffer layer 114 and laterally surrounds the composite grid structure 116.

A light shield structure 118 is disposed within the buffer layer 114, above the back-side surface 102b of the semiconductor substrate 102, and extends laterally between neighboring composite grid segments 116a, 116b of the composite grid structure 116. The light shield structure 118 directly overlies a first photodetector 104a in the plurality of photodetectors 104. In some embodiments, the light shield structure 118 has a first end that terminates under a first composite grid segment 116a of the composite grid structure 116, and has a second end that terminates under a second composite grid segment 116b of the composite grid structure 116. In further embodiments, the light shield structure 118 comprises, for example, a metal material (e.g., gold, copper, titanium, tantalum, tungsten, another metal material, or any combination of the foregoing), a metal oxide (e.g., titanium oxide ($TiO_2$), tantalum oxide ($Ta_2O_5$), tungsten oxide ($WO_3$), another metal oxide, or any combination of the foregoing), a dielectric material (e.g., silicon dioxide, or another dielectric material), a nitride (e.g., titanium nitride, tantalum nitride, or another nitride), a polymer (e.g., poly (3-hexylthiophene) (P3HT), conjugated polymers based on benzodithiophene (BDT), or another polymer), an organic material (e.g., a carbon nanotube (CNT), or another organic material), an inorganic material (e.g., copper zinc tin sulfide ($Cu_2ZnSnS_4$), or another inorganic material), another suitable material, or any combination of the foregoing. By virtue of a material, location, and/or shape of the light shield structure 118, the light shield structure 118 is configured to block/impede at least a portion of incident light from reaching the first photodetector 104a, thereby decreasing a quantum efficiency (QE) of the first photodetector 104a. Further, the light shield structure 118 is laterally offset from at least a portion of a second photodetector 104b in the plurality of photodetectors 104, such that incident light 130 disposed directly over the second photodetector 104b is not blocked by the light shield structure 118. This increases a QE of the second photodetector 104b, such that the QE of the first photodetector 104a is less than the QE of the second photodetector 104b.

During operation of the image sensor 100, by virtue of the first photodetector 104a having a relatively low QE (i.e., less than the QE of the second photodetector 104b), an exposure period of the image sensor 100 may be increased while decreasing blooming in the plurality of photodetectors 104. This, in part, is because the light shield structure 118 will decrease charge (e.g., photons) collected by the first photodetector 104a during the increased exposure period, thereby mitigating a leakage of accumulated charge from the first photodetector 104a, through the semiconductor substrate 102, to neighboring photodetectors (e.g., the second photodetector 104b). Thus, the relatively low QE of the first photodetector 104a prevents over exposure during the increased exposure period that may otherwise cause blooming among the plurality of photodetectors 104. Further, increasing the exposure period of the image sensor 100 while allows for the acquisition of high-quality image data, especially in low light applications (e.g., at night), thereby increasing a sensitivity of the image sensor 100.

In some embodiments, such as the embodiment of FIG. 1A, the light shield structure 118 is embedded in the buffer layer 114, such that the buffer layer 114 contacts a top surface of the light shield structure 118, contacts a lower surface of the light shield structure 118, and contacts sidewall surfaces of the light shield structure 118. Thus, a first outer portion of the top surface of the light shield structure 118 (e.g., left side) is spaced apart from a bottom surface of the first composite grid segment 116a by the buffer layer 114, and a second outer portion of the top surface of the light shield structure 118 (e.g., right side) is spaced apart from a bottom surface of the second composite grid segment 116b by the buffer layer 114. By embedding the light shield structure 118 in the buffer layer 114 and below the composite grid structure 116, a distance d1 between the lower surface of the light shield structure 118 and the back-side surface 102b of the semiconductor substrate 102 is reduced. This, in part, mitigates incident light 130 from reaching the first photodetector 104a and increases optical isolation between the first and second photodetectors 104a-b while maintaining the relatively low QE of the first photodetector 104a. For example, reducing the distance d1 may block and/or mitigate incident light 130 disposed at an angle relative to a top surface of the buffer layer 114 from reaching the first photodetector 104a. Therefore, the light shield structure 118 decreases crosstalk in the plurality of photodetectors 104 while maintaining the difference in QE between the first and second photodetectors 104a-b, thereby increasing a performance of the image sensor 100. In further embodiments, such as the embodiment of FIG. 1B, when viewed from above, an area of the light shield structure 118 is greater than an area of the first photodetector 104a, thereby further decreasing incident light disposed upon the first photodetector 104a.

Figure 2A:
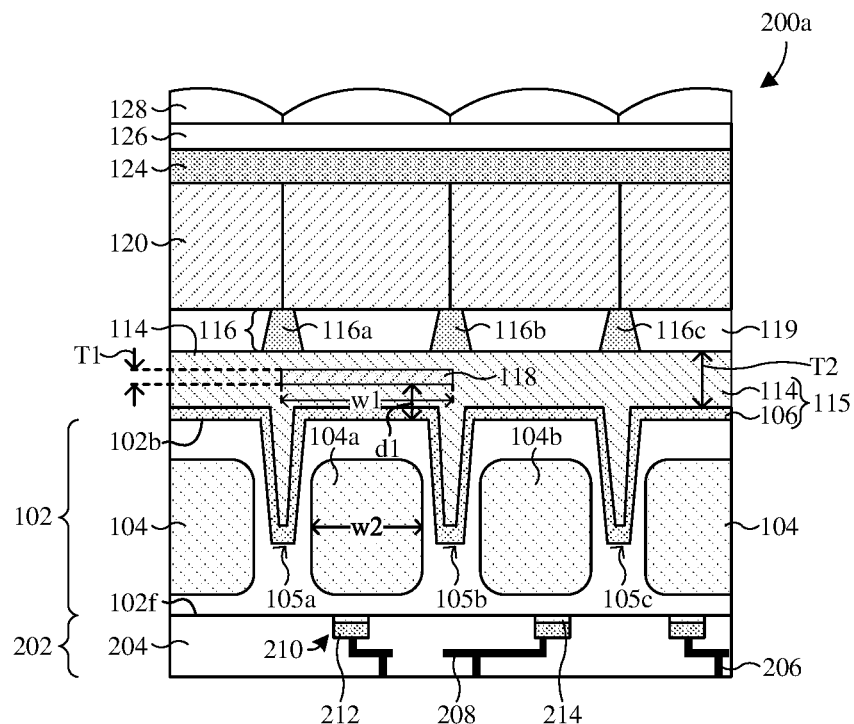
FIGS. 2A-C, 3A-C, and 4A-B illustrate various cross-sectional views of some alternative embodiments of the image sensor of FIG. 1A, in which an interconnect structure is disposed along a front-side surface of the semiconductor substrate.

FIG. 2A illustrates a cross-sectional view of some embodiments of an image sensor 200a comprising a semiconductor substrate 102 and a light shield structure 118 embedded within a buffer layer 114 that overlies the semiconductor substrate 102.

The image sensor 200a includes an interconnect structure 202 disposed along a front-side surface 102f of the semiconductor substrate 102. In various embodiments, the image sensor 200a may be configured as a back-side illumination complementary metal-oxide semiconductor image sensor (BSICIS) that allows incident light to penetrate from a back-side surface 102b of the semiconductor substrate 102. It will be appreciated that the image sensor 200a being configured as another CIS is also within the scope of the disclosure. In some embodiments, the semiconductor substrate 102 may, for example, be or comprise a bulk substrate (e.g., a bulk silicon substrate), a silicon-on-insulator (SOI) substrate, crystalline silicon, P-doped silicon, or another suitable semiconductor material and/or may comprise a first doping type (e.g., p-type). The interconnect structure 202 includes a plurality of conductive vias 206, a plurality of conductive wires 208, and an interconnect dielectric structure 204. The interconnect dielectric structure 204 comprises one or more inter-level dielectric (ILD) layers. The plurality of conductive vias 206 and the plurality of conductive wires 208 are disposed within the interconnect dielectric structure 204 and are configured to electrically couple semiconductor devices within the image sensor 200a to one another and/or to another integrated circuit (IC) (not shown). Further, the interconnect structure 202 is configured to facilitate readout of the plurality of photodetectors 104 disposed within the semiconductor substrate 102. In some embodiments, the interconnect dielectric structure 204 may, for example, be or comprise a low-k dielectric material, an extreme low-k dielectric material, an oxide such as silicon dioxide, another dielectric material, or any combination of the foregoing. In yet further embodiments, the plurality of conductive vias 206 and the plurality of conductive wires 208 may, for example, respectively be or comprise aluminum, copper, titanium nitride, tantalum nitride, ruthenium, another conductive material, or any combination of the foregoing.

A plurality of pixel devices 210 are disposed along the front-side surface 102f of the semiconductor substrate 102. In some embodiments, the plurality of pixel devices 210 may comprise a gate electrode 212 and a gate dielectric layer 214 disposed between the semiconductor substrate 102 and the gate electrode 212. In further embodiments, the plurality of pixel devices 210 may, for example, be or comprise transfer transistor(s), source-follower transistor(s), row select transistor(s), reset transistor(s), another suitable semiconductor device, or any combination of the foregoing. The pixel devices 210 are electrically coupled to the interconnect structure 202 by way of the plurality of conductive vias and wires 206, 208.

The plurality of photodetectors 104 are disposed within the semiconductor substrate 102 between the front-side surface 102f and the back-side surface 102b of the semiconductor substrate 102. In some embodiments, the plurality of photodetectors 104 comprise a second doping type (e.g., n-type) that is opposite the first doping type (e.g., p-type). In further embodiments, the first doping type may be p-type and the second doping type may be n-type, or vice versa. Further, the plurality of pixel devices 210 are configured to conduct readout of the photodetectors 104 by way of the interconnect structure 202. The plurality of photodetectors 104 comprises a first photodetector 104a and a second photodetector 104b neighboring the first photodetector 104a.

An isolation structure 115 overlies the back-side surface 102b of the semiconductor substrate 102 and comprises one or more protrusions that fill trenches 105a-c of the semiconductor substrate 102. The isolation structure 115 laterally surrounds each photodetector 104 and is configured to increase optical and/or electrical isolation between adjacent photodetectors 104. The isolation structure 115 may, for example, be configured as a back-side trench isolation (BTI) structure, a deep trench isolation (DTI) structure, a back-side DTI (BDTI) structure, or another suitable isolation structure. The isolation structure 115 extends into the back-side surface 102b of the semiconductor substrate 102 to a point below the back-side surface 102b of the semiconductor substrate 102. In some embodiments, the isolation structure 115 comprises a dielectric liner 106 and a buffer layer 114, where the dielectric liner 106 is disposed between the semiconductor substrate 102 and the buffer layer 114. In some embodiments, the dielectric liner 106 may, for example, be or comprise a dielectric material, an oxide such as silicon dioxide, or the like. In some embodiments, the buffer layer 114 may, for example, be or comprise silicon dioxide ($SiO_2$), a metal oxide (e.g., such as aluminum oxide, tantalum oxide, etc.), a polymer, an organic material, an inorganic material, another suitable dielectric material, or any combination of the foregoing.

A composite grid structure 116 overlies the buffer layer 114 and comprises a plurality of composite grid segments 116a-c. In some embodiments, the composite grid structure 116 may be configured as a metal grid structure, a dielectric grid structure, or a combination of the foregoing. The composite grid structure 116 is configured to direct incident light to the plurality of photodetectors 104. In some embodiments, when the composite grid structure 116 comprises a metal material (e.g., the composite grid structure 116 comprises copper, titanium tungsten, another metal material, or any combination of the foregoing), light may reflect off of the sidewalls of the composite grid structure 116 to the underlying photodetectors 104. In such embodiments, the composite grid structure 116 may block light disposed at an angle relative to the back-side surface 102b of the semiconductor substrate 102 from traveling from over a photodetector 104 to an adjacent photodetector 104. This, in part, decreases crosstalk among the plurality of photodetectors 104, thereby increasing a performance of the image sensor 200a. A dielectric structure 119 overlies the buffer layer 114 and is disposed laterally between the composite grid segments 116a-c of the composite grid structure 116. In some embodiments, the dielectric structure 119 may, for example, be or comprise silicon dioxide, another dielectric material, or any combination of the foregoing.

In addition, a light filter array (e.g., a color filter array) having a plurality of light filters 120 (e.g., color filters) is disposed over the composite grid structure 116. In some embodiments, the plurality of light filters 120 may comprise a red color filter, a blue color filter, a green color filter, another suitable light filter (e.g., an infrared (IR) light filter), or any combination of the foregoing. The plurality of light filters 120 are each configured to pass wavelengths within a first range of wavelengths while blocking other wavelengths that are different from the first range of wavelengths. The plurality of light filters 120 comprise a first light filter 120a that directly overlies the first photodetector 104a and the second light filter 120b that directly overlies a second photodetector 104b. A first interface layer 124 overlies the plurality of light filters 120 and an anti-reflective coating (ARC) layer 126 overlies the first interface layer 124. The ARC layer 126 is configured to prevent reflection of light away from the back-side surface 102b of the semiconductor substrate 102. Further, a plurality of microlenses 128 overlie the plurality of light filters 120. In some embodiments, the microlenses 128 each have a rounded upper surface such that the microlenses 128 are configured to focus light onto the photodetectors 104. In some embodiments, the first interface layer 124 may, for example, be or comprise silicon dioxide, another dielectric material, or any combination of the foregoing. In yet further embodiments, the ARC layer 126 may, for example, be or comprise titanium oxide, tantalum oxide, silicon dioxide, another suitable material, or any combination of the foregoing.

The light shield structure 118 is disposed within the buffer layer 114 vertically between the composite grid structure 116 and the back-side surface 102b of the semiconductor substrate 102. In some embodiments, the light shield structure 118 directly overlies the first photodetector 104a. In further embodiments, the light shield structure 118 comprises, for example, a metal material (e.g., copper, titanium, tantalum, another metal material, or any combination of the foregoing), a metal oxide (e.g., aluminum oxide, titanium oxide, tantalum oxide, another metal oxide, or any combination of the foregoing), a dielectric material (e.g., silicon dioxide, or another dielectric material), a polymer, an organic material, an inorganic material, another suitable material, or any combination of the foregoing. The light shield structure 118 is configured to block/impede at least a portion of incident light from reaching the first photodetector 104a, thereby decreasing a quantum efficiency (QE) of the first photodetector 104a. In some embodiments, the QE is a ratio of a number of carriers collected or absorbed by a corresponding photodetector to a number of photons disposed on the corresponding photodetector by incident light. In such embodiments, if all photons of a given wavelength of incident light are absorbed by the corresponding photodetector, then the QE at that wavelength is unity (i.e., the QE of the corresponding photodetector has a value of 1). In further embodiments, the light shield structure 118 is laterally offset from the second photodetector 104b, such that a QE of the second photodetector 104b is greater than the QE of the first photodetector 104a. In addition, by virtue of the light shield structure 118 being disposed below the composite grid structure 116, the distance d1 between the light shield structure 118 and the back-side surface 102b of the semiconductor substrate 102 is reduced. This, in part, increases an ability for the light shield structure 118 to effectively reduce the QE of the first photodetector 104a while reducing crosstalk from incident light disposed over adjacent photodetectors 104, thereby increasing a performance of the image sensor 200a.

During operation of the image sensor 200a, a shutter opens to expose the plurality of photodetectors 104 to incident light (e.g., an optical image) and each photodetector 104 records light impingent at their respective location for some exposure period. In some alternative cases, rows of photodetectors 104 are enabled without a mechanical shutter being used (so called "rolling shutter") or the entire array can be "flashed" on at once to record the image. Whatever the precise implementation, while the shutter is open the light that reaches each photodetector 104 causes electron-hole recombination in the corresponding photodetector 104, causing charge carriers to build up in each photodetector 104 according to the light intensity received at the corresponding photodetector 104. The charge carriers may be readout by the plurality of pixel devices 210 and interconnect structure 202 to determine the intensity of light detected by each photodetector 104 during the exposure period and reconstruct a digital version of the image.

In some embodiments, blooming may occur when the amount of charge carriers generated at a photodetector 104 exceeds the storage capacity (e.g., full well capacity (FWC)) of the photodetector 104 and excess charge overflows into neighboring photodetectors 104. For example, if the first photodetector 104a was struck with high-intensity light that over-saturated the storage capacity of the first photodetector 104a, then excess charge could leak out through the semiconductor substrate 102 to neighboring photodetectors 104 (e.g., the second photodetector 104b), causing these photodetectors 104 to report misleadingly high levels. Blooming may occur if the exposure period is too long and/or the incident light on the corresponding photodetector 104 is too bright. This excess or overflow charge is indistinguishable from the charge that would be generated in the neighboring photodetectors 104 if those photodetectors 104 had been subjected to light. Hence, in such embodiments, the neighboring photodetectors 104 (e.g., the second photodetector 104b) appear to be irradiated with more light than actually impingent thereon due to the excess or overflow charge. Accordingly, a small, high-intensity, light irradiation pattern at one or more photodetectors 104 appears to "bloom" into a much larger pattern over neighboring photodetectors 104 as well.

By virtue of the light shield structure 118 directly overlying the first photodetector 104a, the first photodetector 104a has a relatively low QE (e.g., less than the QE of the second photodetector 104b), and the exposure period of the image sensor 100 may be increased while decreasing blooming among the plurality of photodetectors 104. This, in part, is because the light shield structure 118 will decrease an intensity of light received at the first photodetector 104a during the increased exposure period, thereby preventing saturation of the storage capacity (e.g., FWC) of the first photodetector 104a. Thus, the relatively low QE of the first photodetector 104a prevents over exposure during the increased exposure period that may otherwise cause blooming among the plurality of photodetectors 104. This increases an ability of the image sensor 200a to produce high-quality image data, especially in low light applications (e.g., at night), thereby increasing a sensitivity and accuracy of the image sensor 100.

In addition, by disposing the light shield structure 118 in the buffer layer 114 and below the composite grid structure 116, a distance d1 between the lower surface of the light shield structure 118 and the back-side surface 102b of the semiconductor substrate 102 is reduced. This, in part, mitigates incident light from reaching the first photodetector 104a and increases optical isolation between the first and second photodetectors 104a-b while maintaining the relatively low QE of the first photodetector 104a. For example, reducing the distance d1 may block and/or mitigate incident light disposed at an angle relative to the top surface of the buffer layer 114 from reaching the first photodetector 104a. Therefore, the light shield structure 118 decreases crosstalk and blooming in the plurality of photodetectors while maintaining the difference in QE between the first and second photodetectors 104a-b, thereby increasing an overall performance of the image sensor 200a.

In some embodiments, the distance d1 is within a range of about 10 and 50,000 angstroms. It will be appreciated that the distance d1 having other values is also within the scope of the disclosure. In further embodiments, if the distance d1 is relatively small (e.g., less than about 10 angstroms), then an etching process (e.g., a dry etch process) utilized to form the composite grid structure 116 and/or the light shield structure 118 may damage the dielectric liner 106 and/or the back-side surface 102b of the semiconductor substrate 102. This may result in delamination of the dielectric liner 106 and/or damage to the back-side surface 102b of the semiconductor substrate 102, thereby decreasing a structural integrity of the image sensor 200a. In yet further embodiments, if the distance d1 is relatively large (e.g., greater than about 50,000 angstroms), then an increased amount of incident light disposed at an angle relative to the top surface of the buffer layer 114 may reach the first photodetector 104a, thereby increasing crosstalk among the plurality of photodetectors 104. In various embodiments, a first width w1 of the light shield structure 118 is greater than a second width w2 of the first photodetector 104a, thereby mitigating blooming and crosstalk among the plurality of photodetectors 104.

In some embodiments, a first thickness T1 of the light shield structure 118 is within a range of about 10 to 50,000 angstroms. It will be appreciated that the first thickness T1 having other values is also within the scope of the disclosure. In various embodiments, if the first thickness T1 is relatively small (e.g., less than about 10 angstroms), then a total thickness variation (TTV) of the light shield structure 118 may be substantially large, thereby decreasing an ability of the light shield structure 118 to effectively reduce the QE of the first photodetector 104a. This may result in increased blooming and crosstalk among the plurality of photodetectors 104. In yet further embodiments, if the first thickness T1 is relatively large (e.g., greater than about 50,000 angstroms), then the light shield structure 118 may completely block incident light from reaching the first photodetector 104a, thereby decreasing a sensitivity of the image sensor 200a. Further, a second thickness T2 of the buffer layer 114 is defined from a top surface of the dielectric liner 106 to the top surface of the buffer layer 114. In various embodiments, the second thickness T2 is within a range of about 200 to 50,000 angstroms. It will be appreciated that the second thickness T2 having other values is also within the scope of the disclosure. In some embodiments, if the second thickness T2 is relatively small (e.g., less than about 200 angstroms), then an etching process (e.g., a dry etch process) utilized to form the composite grid structure 116 may damage the dielectric liner 106 and/or the back-side surface 102b of the semiconductor substrate 102. This may result in delamination of the dielectric liner 106 and/or damage to the back-side surface 102b of the semiconductor substrate 102, thereby decreasing a structural integrity of the image sensor 200a. In further embodiments, if the second thickness T2 is relatively large (e.g., greater than about 50,000 angstroms), then crosstalk among the plurality of photodetectors 104 may be increased. In yet further embodiments, the first thickness T1 of the light shield structure 118 is less than the second thickness T2 of the buffer layer 114.

In yet further embodiments, the light shield structure 118 may comprise a first material (e.g., titanium nitride, titanium oxide, tantalum oxide, etc.) and the buffer layer 114 may comprise a second material (e.g., silicon dioxide) that is different than the first material. The light shield structure 118 has a first refractive index and the buffer layer 114 has a second refractive index. In some embodiments, the first refractive index is greater than the second refractive index. In further embodiments, the first refractive index of the light shield structure 118 may be within a range of about 1.35 to 2.76, greater than about 1.3, or another suitable value. In yet further embodiments, the second refractive index of the buffer layer 114 may be within a range of about 1 to 2, within a range of about 1 to 1.45, or another suitable value.

Figure 2B:
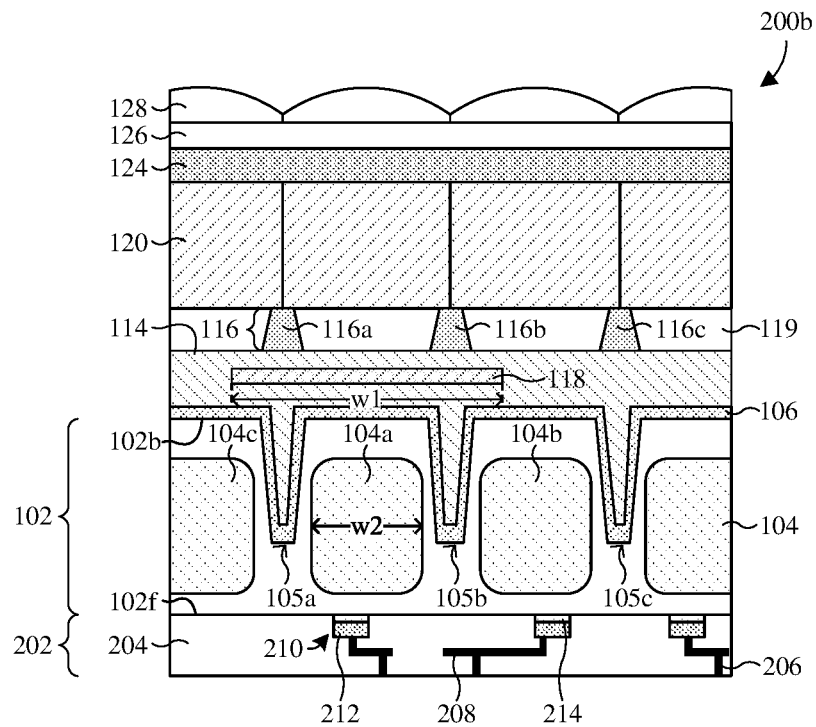

FIG. 2B illustrates a cross-sectional view of some embodiments of an image sensor 200b according to some alternative embodiments of the image sensor 200a of FIG. 2A, in which the plurality of photodetectors 104 includes the first photodetector 104a, the second photodetector 104b, and a third photodetector 104c. The first photodetector 104a is disposed laterally between the second and third photodetectors 104b, 104c. In some embodiments, a first outer edge of the light shield structure 118 (e.g., left side) directly overlies at least a portion of the third photodetector 104c, and a second outer edge of the light shield structure 118 (e.g., right side) directly overlies at least a portion of the second photodetector 104b. This, in part, may further mitigate incident light from reaching the first photodetector 104a, thereby further decreasing the QE of the first photodetector 104a. Further, the light shield structure 118 directly overlying the portions of the second and third photodetector 104b, 104c further decreases crosstalk among the plurality of photodetectors 104, thereby further decreasing noise (e.g., flicker noise) in the image sensor 200b. In various embodiments, the first and second composite grid segments 116a, 116b are spaced laterally between opposing outer sidewalls of the light shield structure 118. In further embodiments, the light shield structure 118 continuously laterally extends from over a first trench 105a to a second trench 105b that each extend downward into the back-side surface 102b of the semiconductor substrate 102. In yet further embodiments, a ratio between the first width w1 of the light shield structure 118 and the second width w2 of the first photodetector 104a is 2:1 or another suitable value.

Figure 2C:
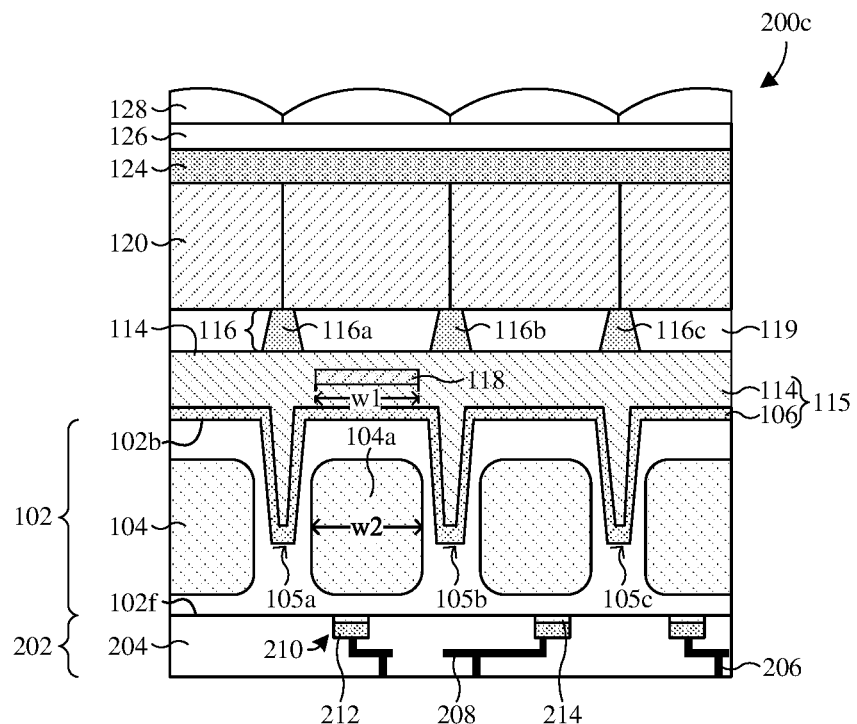

FIG. 2C illustrates a cross-sectional view of some embodiments of an image sensor 200c according to some alternative embodiments of the image sensor 200a of FIG. 2A, in which the first width w1 of the light shield structure 118 is less than the second width w2 of the first photodetector 104a. Thus, in some embodiments, opposing outer sidewalls of the light shield structure 118 are spaced laterally between opposing outer sidewalls of the first photodetector 104a.

Figure 3A:
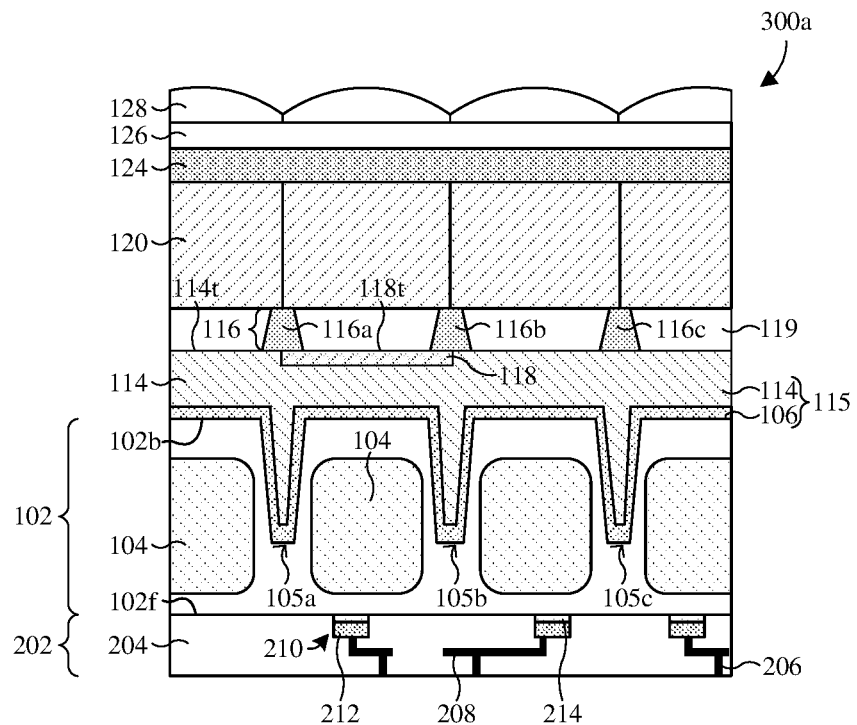

FIG. 3A illustrates a cross-sectional view of some embodiments of an image sensor 300a according to some alternative embodiments of the image sensor 200a of FIG. 2A, in which the light shield structure 118 has a top surface 118t that is coplanar with a top surface 114t of the buffer layer 114. In some embodiments, a first outer portion of the top surface of the light shield structure 118 directly contacts a bottom surface of the first composite grid segment 116a, and a second outer portion of the top surface of the light shield structure 118 directly contacts a bottom surface of the second composite grid segment 116b.

Figure 3B:
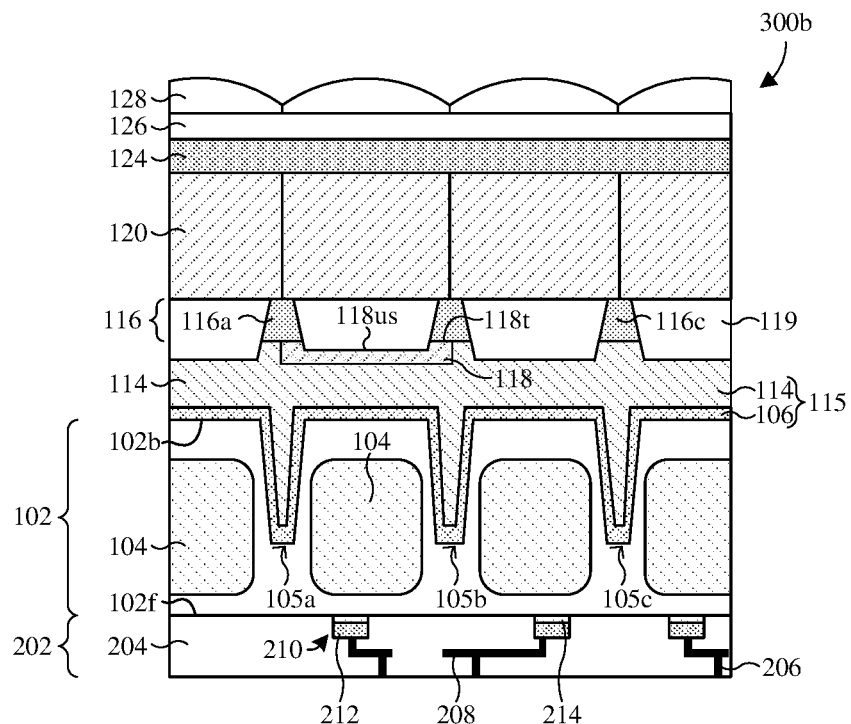

FIG. 3B illustrates a cross-sectional view of some embodiments of an image sensor 300b according to some alternative embodiments of the image sensor 300a of FIG. 3A, in which the top surface 118t of the light shield structure 118 is vertically above an upper surface 118us of the light shield structure 118. In such embodiments, the dielectric structure 119 continuously extends from inner opposing sidewalls of the light shield structure 118 to the upper surface 118us of the light shield structure 118.

Figure 3C:
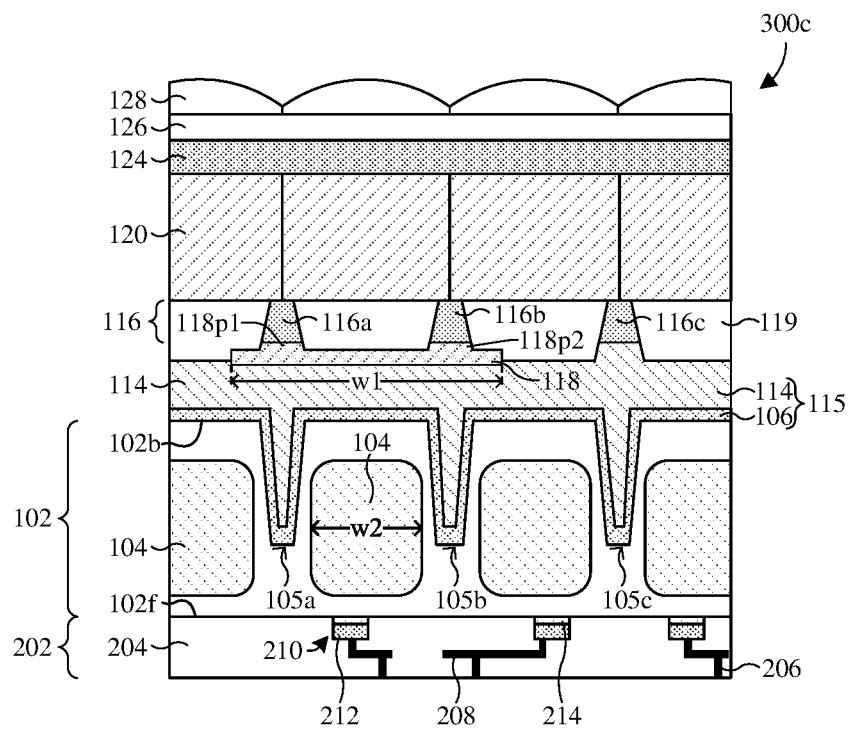

FIG. 3C illustrates a cross-sectional view of some embodiments of an image sensor 300c according to some alternative embodiments of the image sensor 300a of FIG. 3A, in which the light shield structure 118 comprises protrusions 118p1, 118p2 that extend vertically into the dielectric structure 119. In some embodiments, a first protrusion 118p1 of the light shield structure 118 comprises opposing sidewalls that are aligned with opposing sidewalls of the first composite grid segment 116a, and a second protrusion 118p2 of the light shield structure 118 comprises opposing sidewalls that are aligned with opposing sidewalls of the second composite grid segment 116b.

Figure 4A:
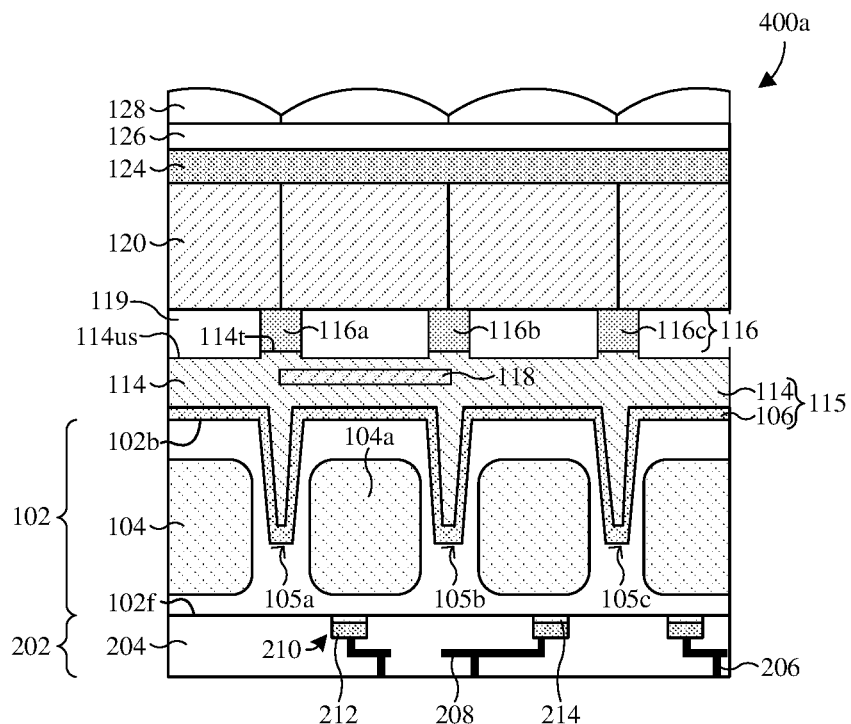

FIG. 4A illustrates a cross-sectional view of some embodiments of an image sensor 400a according to some alternative embodiments of the image sensor 200a of FIG. 2A, in which the composite grid segments 116a-c respectively comprise straight opposing outer sidewalls. Further, the buffer layer 114 may comprise a top surface 114t that is disposed vertically above an upper surface 114us of the buffer layer 114.

Figure 4B:
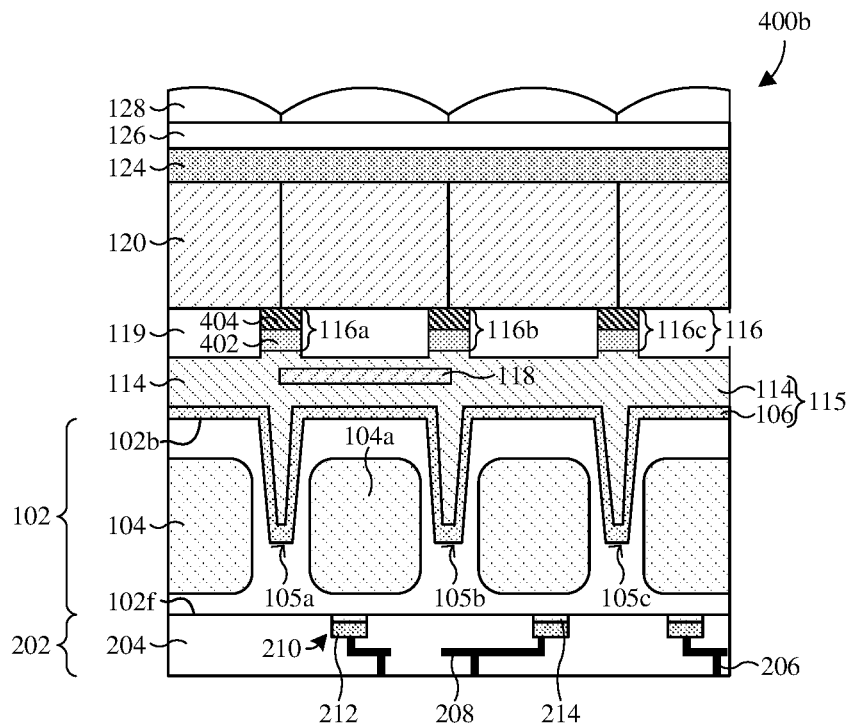

FIG. 4B illustrates a cross-sectional view of some embodiments of an image sensor 400a according to some alternative embodiments of the image sensor 400a of FIG. 4A, in which the composite grid structure 116 comprises a metal grid structure 402 and a dielectric grid structure 404 that overlies the metal grid structure 402. In some embodiments, the metal grid structure 402 comprises a metal material (e.g., tungsten, aluminum, copper, another metal material, or any combination of the foregoing) configured to direct light towards the plurality of photodetectors 104. In further embodiments, the dielectric grid structure 404 comprises a dielectric material (e.g., titanium oxide, tantalum oxide, silicon dioxide, another dielectric material, or any combination of the foregoing) configured to achieve total internal reflection (TIR) with the dielectric structure 119, or vice versa, thereby directing light towards the plurality of photodetectors 104.

FIGS. 5-15 illustrate cross-sectional views 500-1500 of some embodiments of a first method of forming an image sensor comprising a buffer layer disposed over a back-side surface of a semiconductor substrate and a light shield structure disposed within the buffer layer, according to the present disclosure. Although the cross-sectional views 500-1500 shown in FIGS. 5-15 are described with reference to the first method, it will be appreciated that the structures shown in FIGS. 5-15 are not limited to the first method but rather may stand alone separate of the method. Furthermore, although FIGS. 5-15 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 5:
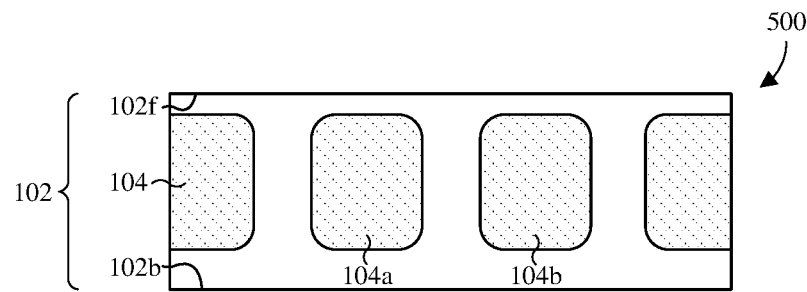
FIGS. 5-15 illustrate cross-sectional views of some embodiments of a first method of forming an image sensor comprising a buffer layer disposed over a back-side surface of a semiconductor substrate and a light shield structure disposed within the buffer layer.

As illustrated in the cross-sectional view 500 of FIG. 5, a semiconductor substrate 102 is provided and a plurality of photodetectors 104 are formed within the semiconductor substrate 102. In some embodiments, the semiconductor substrate 102 may, for example, be or comprise a bulk substrate (e.g., a bulk silicon substrate, a silicon-on-insulator (SOI) substrate), or some other suitable substrate and/or comprises a first doping type (e.g., p-type doping). In some embodiments, the plurality of photodetectors 104 are formed such that each photodetector 104 comprises a second doping type (e.g., n-type doping) that is opposite from the first doping type. For example, the first doping type may be p-type and the second doping type may be n-type, or vice versa. In yet further embodiments, a process for forming the plurality of photodetectors 104 may include: forming a masking layer (not shown) over a front-side surface 102f of the semiconductor substrate 102; selectively implanting dopants into the front-side surface 102f of the semiconductor substrate 102 according to the masking layer, thereby forming the plurality of photodetectors within the semiconductor substrate 102; and performing a removal process to remove the masking layer from over the front-side surface 102f of the semiconductor substrate 102 (not shown). The plurality of photodetectors 104 comprises a first photodetector 104a and a second photodetectors 104b.

Figure 6:
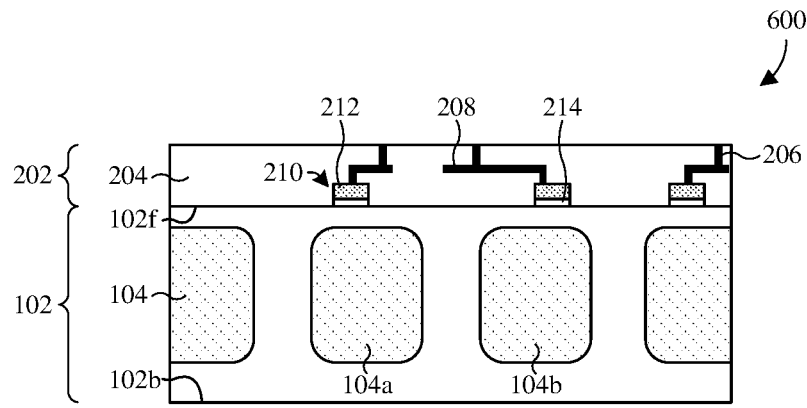

As illustrated in the cross-sectional view 600 of FIG. 6, a plurality of pixel devices 210 and an interconnect structure 202 are formed over the front-side surface 102f of the semiconductor substrate 102. In some embodiments, the plurality of pixel devices 210 are formed over the semiconductor substrate 102 such that each pixel device 210 comprises a gate dielectric layer 214 and a gate electrode 212. In further embodiments, a process for forming the pixel devices 210 includes: depositing (e.g., by chemical vapor deposition (CVD), physical vapor deposition (PVD), atomic layer deposition (ALD), or another suitable growth or deposition process) a gate dielectric film over the front-side surface 102f of the semiconductor substrate; depositing (e.g., by CVD, PVD, ALD, sputtering, electroless plating, electro plating, or another suitable growth or deposition process) a gate electrode layer over the gate dielectric film; and patterning the gate dielectric film and the gate electrode layer, thereby forming the gate dielectric layer 214 and the gate electrode 212, respectively. In some embodiments, the gate dielectric layer 214 may, for example, be or comprise a high-k dielectric material, aluminum oxide, hafnium oxide, silicon dioxide, another dielectric material, or any combination of the foregoing. In further embodiments, the gate electrode 212 may, for example, be or comprise aluminum, titanium, tantalum, polysilicon, doped polysilicon, a silicide, another conductive material, or any combination of the foregoing.

Further, the interconnect structure 202 comprises an interconnect dielectric structure 204, a plurality of conductive vias 206, and a plurality of conductive wires 208. The interconnect dielectric structure 204 may, for example, be formed by one or more CVD process(es), PVD process(es), ALD process(es), another suitable growth or deposition process, or any combination of the foregoing. In further embodiments, the plurality of conductive vias 206 and the plurality of conductive wires 208 may, for example, each be formed by a single damascene process, a dual damascene process, or another suitable formation process. In some embodiments, the interconnect dielectric structure 204 comprises a plurality of inter-level dielectric (ILD) layers that respectively comprise silicon dioxide, a low-k dielectric material, an extreme low-k dielectric material, another dielectric material, or any combination of the foregoing. In yet further embodiments, the plurality of conductive vias 206 and the plurality of conductive wires 208 may, for example, respectively be or comprise copper, aluminum, titanium nitride, tantalum nitride, ruthenium, another conductive material, or any combination of the foregoing.

Figure 7:
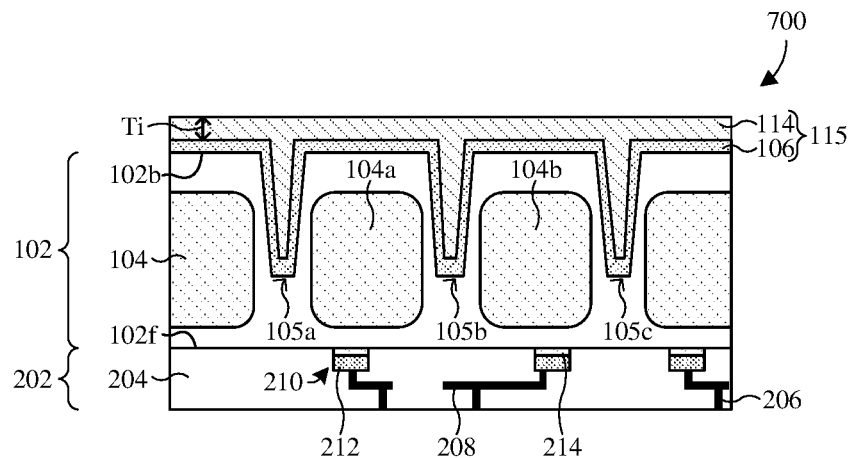

As illustrated in the cross-sectional view 700 of FIG. 7, an isolation structure 115 is formed over and into the back-side surface 102b of the semiconductor substrate 102. In some embodiments, forming the isolation structure 115 includes: forming a masking layer (not shown) over the back-side surface 102b of the semiconductor substrate 102; exposing unmasked regions of the semiconductor substrate 102 to one or more etchants, thereby forming an isolation trench that comprises a plurality of trenches 105a-c extending downward into the back-side surface 102b of the semiconductor substrate 102; depositing (e.g., by CVD, PVD, ALD, or another suitable growth or deposition process) a dielectric liner 106 over the back-side surface 102b of the semiconductor substrate 102 such that the dielectric liner 106 lines the trenches 105a-c; and depositing (e.g., by CVD, PVD, ALD, or another suitable growth or deposition process) a buffer layer 114 over the dielectric liner 106 and the back-side surface 102b of the semiconductor substrate 102, thereby forming the isolation structure 115. In some embodiments, the buffer layer 114 is deposited with an initial thickness Ti that is defined between a top surface of the dielectric liner 106 and a top surface of the buffer layer 114. In further embodiments, the buffer layer 114 may, for example, be or comprise silicon dioxide, a metal oxide (e.g., such as aluminum oxide, hafnium oxide, etc.), a polymer, an organic material, an inorganic material, another suitable dielectric material, or any combination of the foregoing. In yet further embodiments, the dielectric liner 106 may, for example, be or comprise silicon dioxide, another dielectric material, or the like.

Figure 8:
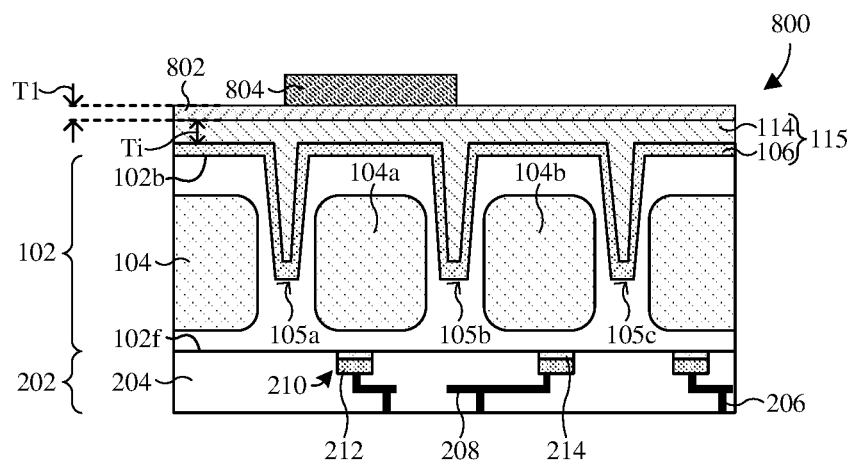

As illustrated in the cross-sectional view 800 of FIG. 8, a light shield layer 802 is formed over the buffer layer 114. In some embodiments, the light shield layer 802 is deposited over the buffer layer 114 by, for example, CVD, PVD, ALD, sputtering, electroless plating, electro plating, or another suitable growth or deposition process. In further embodiments, the light shield layer 802 comprises, for example, a metal material (e.g., gold, copper, titanium, tantalum, tungsten, another metal material, or any combination of the foregoing), a metal oxide (e.g., titanium oxide ($TiO_2$), tantalum oxide ($Ta_2O_5$), tungsten oxide ($WO_3$), another metal oxide, or any combination of the foregoing), a dielectric material (e.g., silicon dioxide, or another dielectric material), a nitride (e.g., titanium nitride, tantalum nitride, or another nitride), a polymer (e.g., poly(3-hexylthiophene) (P3HT), conjugated polymers based on benzodithiophene (BDT), or another polymer), an organic material (e.g., a carbon nanotube (CNT), or another organic material), an inorganic material (e.g., copper zinc tin sulfide ($Cu_2ZnSnS_4$), or another inorganic material), another suitable material, or any combination of the foregoing and may be formed to a first thickness T1 that is within a range of about 10 to 50,000 angstroms, or another suitable thickness value. Further, a masking layer 804 is formed over the light shield layer 802. In some embodiments, the masking layer 804 directly overlies the first photodetector 104a. In further embodiments, the first thickness T1 of the light shield layer 802 is greater than the initial thickness Ti of the buffer layer 114.

Figure 9:
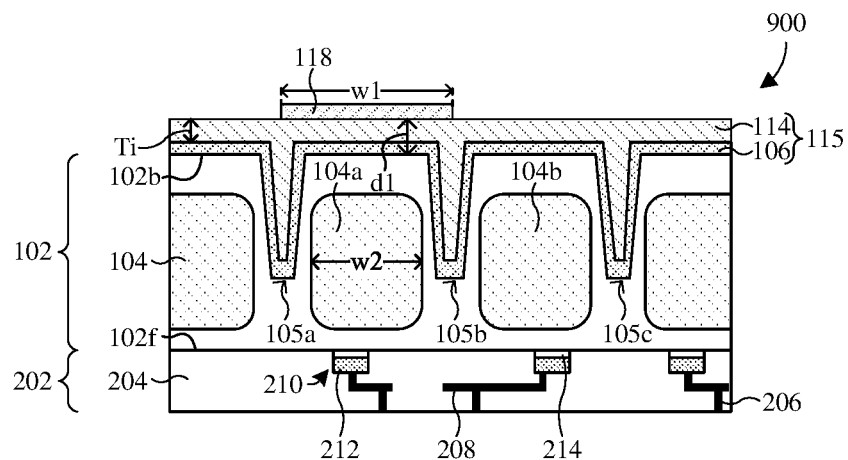

As illustrated in the cross-sectional view 900 of FIG. 9, a patterning process is performed on the light shield layer (802 of FIG. 8) according to the masking layer (804 of FIG. 8), thereby forming a light shield structure 118 over the back-side surface 102b of the semiconductor substrate 102. In some embodiments, the pattering process includes performing a dry etch process, a wet etch process, or another suitable etch process. Further, the patterning process includes exposing unmasking regions of the light shield layer (802 of FIG. 8) to one or more etchants. In further embodiments, the light shield structure 118 may be formed such that a first width w1 of the light shield structure 118 is greater than a second width w2 of the first photodetector 104a. Further, the light shield structure 118 is formed such that a distance d1 between a bottom surface of the light shield structure 118 and the back-side surface 102b of the semiconductor substrate 102 is within a range of about 10 to 50,000 angstroms. It will be appreciated that the distance d1 having other values is within the scope of the disclosure.

Figure 10:
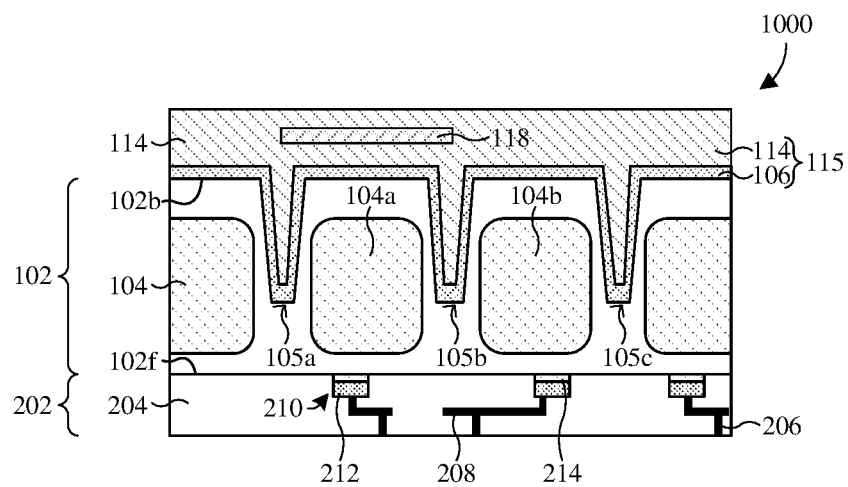

As illustrated in the cross-sectional view 1000 of FIG. 10, additional buffer material is deposited (e.g., by CVD, PVD, ALD, or another suitable deposition or growth process) over the back-side surface 102b of the semiconductor substrate 102 and the light shield structure 118, thereby increasing a thickness of the buffer layer 114 from the initial thickness (Ti of FIG. 9) to a second thickness T2. Thus, in some embodiments, the buffer layer 114 is formed to the second thickness T2 that is within a range of about 200 to 50,000 angstroms. It will be appreciated that the second thickness T2 having other values is within the scope of the disclosure. In yet further embodiments, the additional buffer material may, for example, be or comprise silicon dioxide, a metal oxide (e.g., such as aluminum oxide, hafnium oxide, etc.), a polymer, an organic material, an inorganic material, another suitable dielectric material, or any combination of the foregoing. In yet further embodiments, after depositing the additional buffer material over the back-side surface 102b of the semiconductor substrate 102, a planarization process (e.g., a chemical mechanical polishing (CMP) process) is performed into the buffer layer 114 such that a top surface of the buffer layer 114 is substantially flat.

Figure 11:
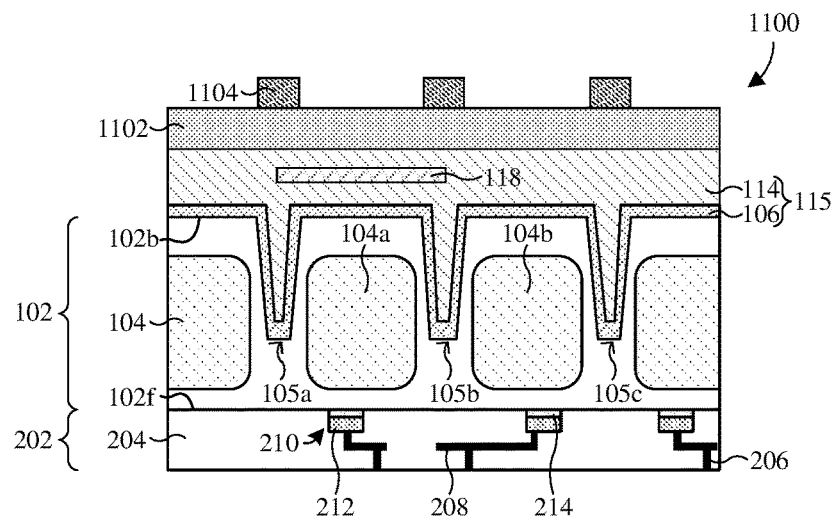

As illustrated in the cross-sectional view 1100 of FIG. 11, a composite grid layer 1102 is deposited over the buffer layer 114 and a masking layer 1104 is formed over the composite grid layer 1102. In some embodiments, the composite grid layer 1102 may be deposited by, for example, CVD, PVD, ALD, sputtering, electroless plating, electro plating, or another suitable deposition or growth process. In further embodiments, the composite grid layer 1102 may comprises a metal material (e.g., titanium, tantalum, tungsten, aluminum, copper, another metal material, or any combination of the foregoing), a dielectric material (e.g., titanium oxide, tantalum oxide, silicon dioxide, another dielectric material, or any combination of the foregoing), another suitable material, or any combination of the foregoing. In yet further embodiments, depositing the composite grid layer 1102 may include performing one or more deposition processes to form a dielectric grid layer (not shown) over a metal grid layer (not shown), such that the dielectric grid layer comprises the dielectric material and the metal grid layer comprises the metal material.

Figure 12:
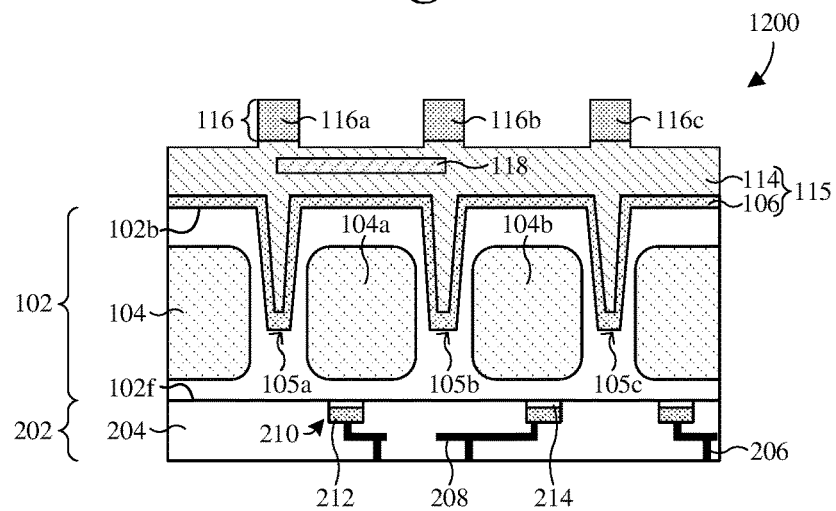

As illustrated in the cross-sectional view 1200 of FIG. 12, a patterning process is performed on the composite grid layer (1102 of FIG. 11) according to the masking layer (1104 of FIG. 11), thereby forming a composite grid structure 116. The composite grid structure 116 is formed such that it comprises a plurality of composite grid segments 116a-c that respectively directly overlie the trenches 105a-c. Further, the composite grid structure 116 comprises a plurality of opposing sidewalls that respectively form a plurality of grid openings that correspond to the plurality of photodetectors 104. In some embodiments, the pattering process includes exposing unmasked regions of the composite grid layer (1102 of FIG. 11) to one or more etchants. In further embodiments, the patterning process includes performing a dry etch process, a wet etch process, another suitable etch process, or any combination of the foregoing. The pattering process may over-etch into the buffer layer 114 such that the patterning process removes at least a portion of the buffer layer 114.

Figure 13:
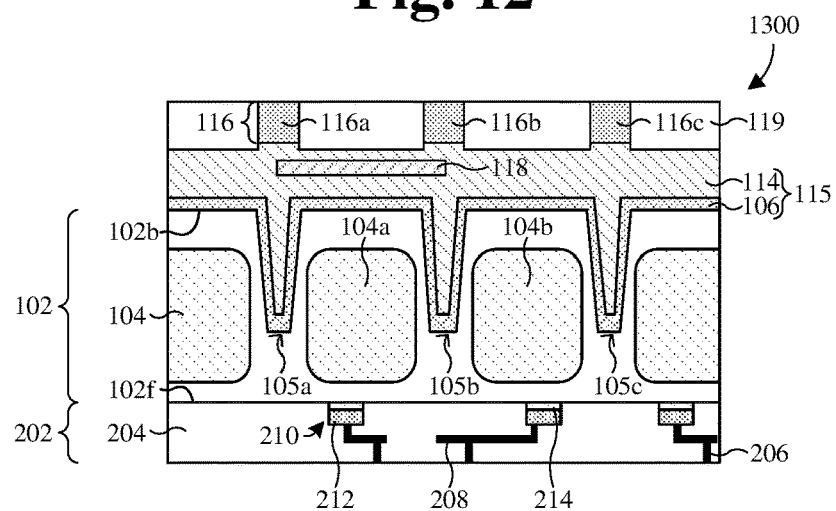

As illustrated in the cross-sectional view 1300 of FIG. 13, a dielectric structure 119 is formed over the buffer layer 114. In some embodiments, a process for forming the dielectric structure 119 includes: depositing (e.g., by CVD, PVD, ALD, or another suitable growth or deposition process) the dielectric structure 119 over the buffer layer 114 and the composite grid structure 116; and performing a planarization process (e.g., a CMP process) into the dielectric structure 119 such that a top surface of the composite grid structure 116 is coplanar with a top surface of the dielectric structure 119.

Figure 14:
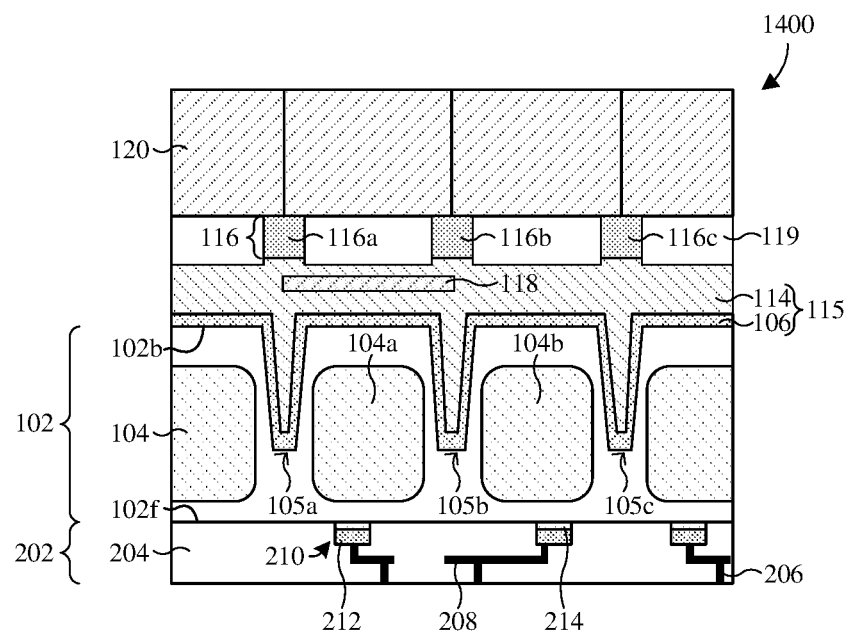

As illustrated in the cross-sectional view 1400 of FIG. 14, a light filter array (e.g., a color filter array) having a plurality of light filters 120 (e.g., color filters) is formed over the dielectric structure 119 and the composite grid structure 116. In some embodiments, the plurality of light filters 120 may, for example, be formed by CVD, PVD, ALD, or another suitable growth or deposition process.

Figure 15:
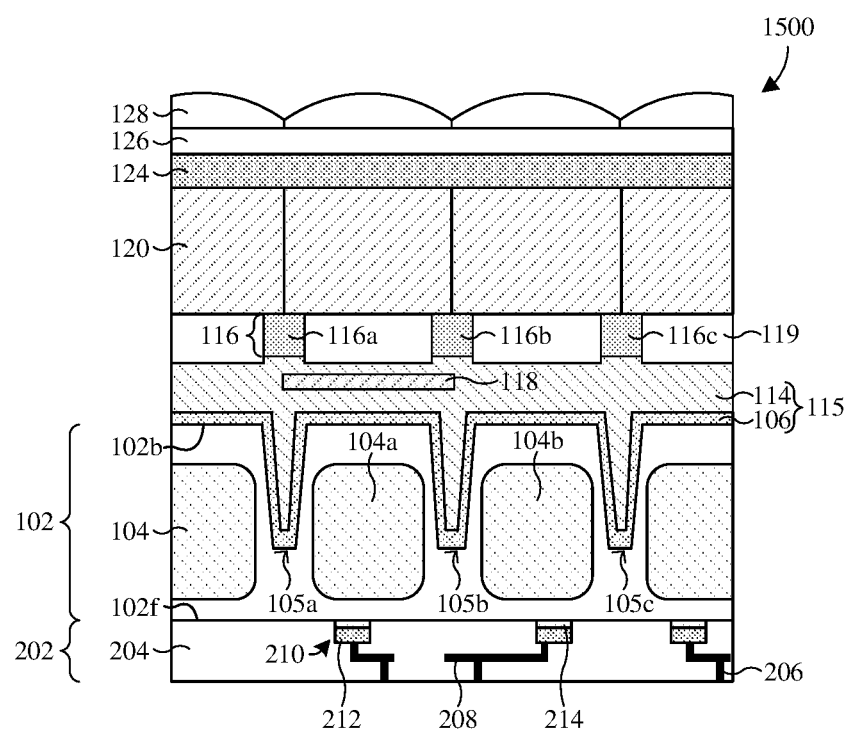

As illustrated in the cross-sectional view 1500 of FIG. 15, a first interface layer 124 is formed over the plurality of light filters 120. An anti-reflective coating (ARC) layer 126 is formed over the first interface layer 124, and a plurality of microlenses 128 are formed over the ARC layer 126. In some embodiments, processes for forming the first interface layer 124, the ARC layer 126, and the plurality of microlenses 128 may include a CVD process, a PVD process, an ALD process, or another suitable growth or deposition process.

FIGS. 16-21 illustrate cross-sectional views 1600-2100 of some embodiments corresponding to a second method of forming an image sensor comprising a buffer layer disposed over a back-side surface of a semiconductor substrate and a light shield structure disposed within the buffer layer, according to the present disclosure. In some embodiments, FIGS. 16-21 illustrate some embodiments of acts that may be performed in place of the acts at FIG. 7-13 of the first method. Thus, the second method illustrates some alternative embodiments of the first method of FIGS. 5-15, for example, the second method may proceed from FIGS. 5-6 to FIGS. 16-21, and then from FIG. 21 to FIGS. 14-15 (skipping FIGS. 7-13). In such embodiments, the second method illustrates some alternative embodiments of forming the light shield structure 118.

Figure 16:
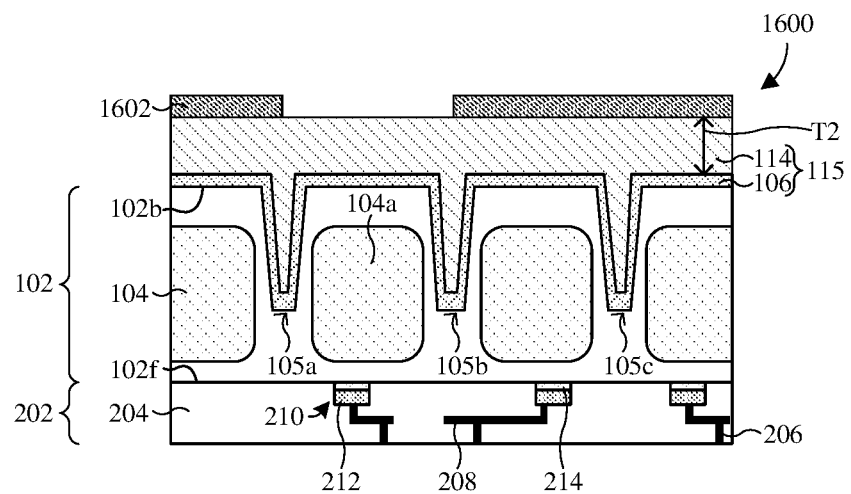
FIGS. 16-21 illustrate cross-sectional views of some embodiments of a second method of forming an image sensor comprising a buffer layer disposed over a back-side surface of a semiconductor substrate and a light shield structure disposed within the buffer layer.

As illustrated in the cross-sectional view 1600 of FIG. 16, an isolation structure 115 is formed into the back-side surface 102b of the semiconductor substrate 102, and a masking layer 1602 is formed over the isolation structure 115. In some embodiments, the isolation structure 115 comprises the dielectric liner 106 and the buffer layer 114. In some embodiments, the isolation structure 115 may be formed by process(es) substantially similar to process(es) described above regarding the formation of the isolation structure 115 of FIG. 7. As illustrated in FIG. 16, in some embodiments, the buffer layer 114 may be formed such the second thickness T2 is within a range of about 200 to 50,000 angstroms. It will be appreciated that the second thickness T2 having another value is within the scope of the disclosure. Subsequently, the masking layer 1602 is formed over the isolation structure such that the masking layer 1602 comprises opposing sidewalls defining an opening directly over the first photodetector 104a.

Figure 17:
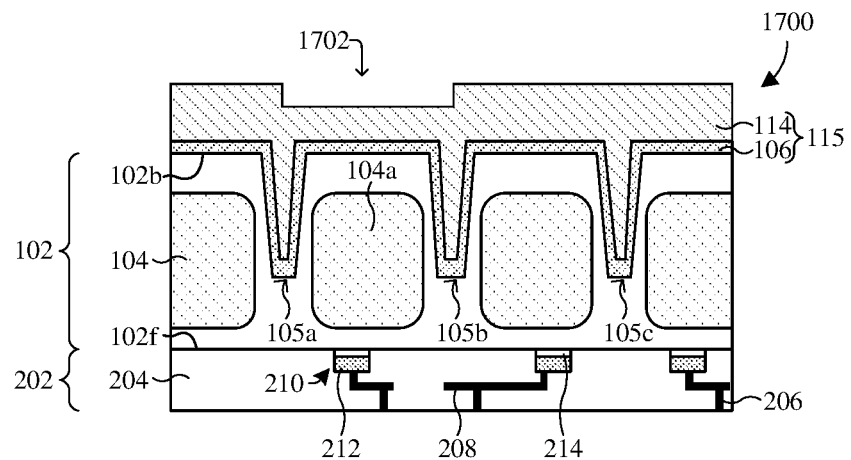

As illustrated in the cross-sectional view 1700 of FIG. 17, a patterning process is performed on the buffer layer 114 according to the masking layer (1602 of FIG. 16), thereby forming a light shield opening 1702 in the buffer layer 114. In some embodiments, the patterning process includes performing a dry etch process, a wet etch process, another suitable etch process, or any combination of the foregoing.

Figure 18:
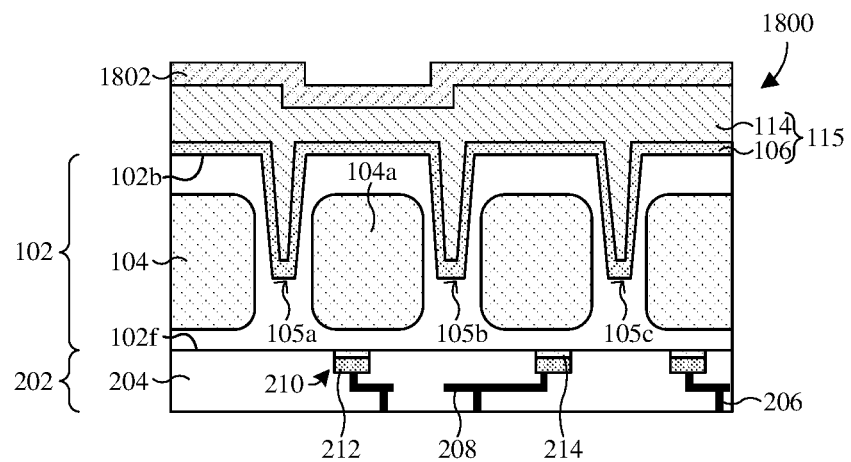

As illustrated in the cross-sectional view 1800 of FIG. 18, a light shield layer 1802 is deposited over the buffer layer 114 such that the light shield layer 1802 fills the light shield opening (1702 of FIG. 17). In some embodiments, the light shield layer 1802 is deposited over the buffer layer 114 by, for example, CVD, PVD, ALD, sputtering, electroless plating, electrochemical plating (ECP), electro plating, or another suitable growth or deposition process. In further embodiments, the light shield layer 1802 comprises, for example, a metal material (e.g., gold, copper, titanium, tantalum, tungsten, another metal material, or any combination of the foregoing), a metal oxide (e.g., titanium oxide ($TiO_2$), tantalum oxide ($Ta_2O_5$), tungsten oxide ($WO_3$), another metal oxide, or any combination of the foregoing), a dielectric material (e.g., silicon dioxide, or another dielectric material), a nitride (e.g., titanium nitride, tantalum nitride, or another nitride), a polymer (e.g., poly(3-hexylthiophene) (P3HT), conjugated polymers based on benzodithiophene (BDT), or another polymer), an organic material (e.g., a carbon nanotube (CNT), or another organic material), an inorganic material (e.g., copper zinc tin sulfide ($Cu_2ZnSnS_4$), or another inorganic material), another suitable material, or any combination of the foregoing and may be formed to a thickness that is within a range of about 10 to 50,000 angstroms, or another suitable thickness value.

Figure 19:
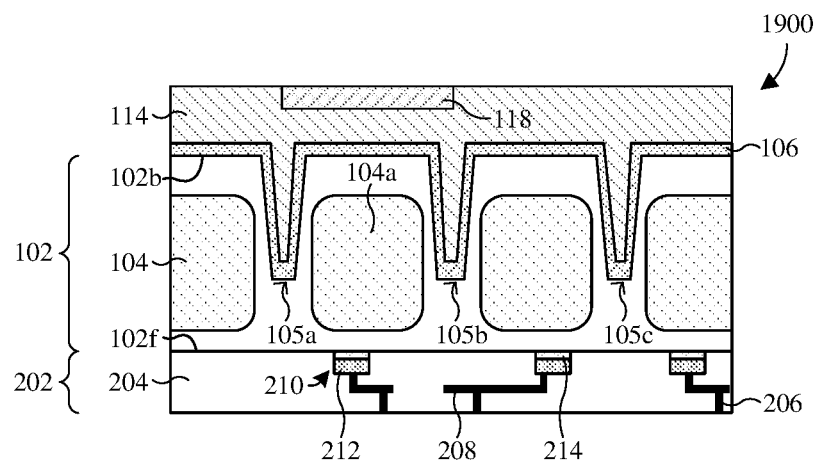

As illustrated in the cross-sectional view 1900 of FIG. 19, a planarization process (e.g., a CMP process) is performed on the light shield layer (1802 of FIG. 18), thereby forming a light shield structure 118. In some embodiments, the light shield structure 118 is formed such that a top surface of the light shield structure 118 is coplanar with a top surface of the buffer layer 114. In further embodiments, the planarization process is performed into the buffer layer 114 such that the top surface of the buffer layer 114 is substantially flat and aligned with the top surface of the buffer layer 114.

Figure 20:
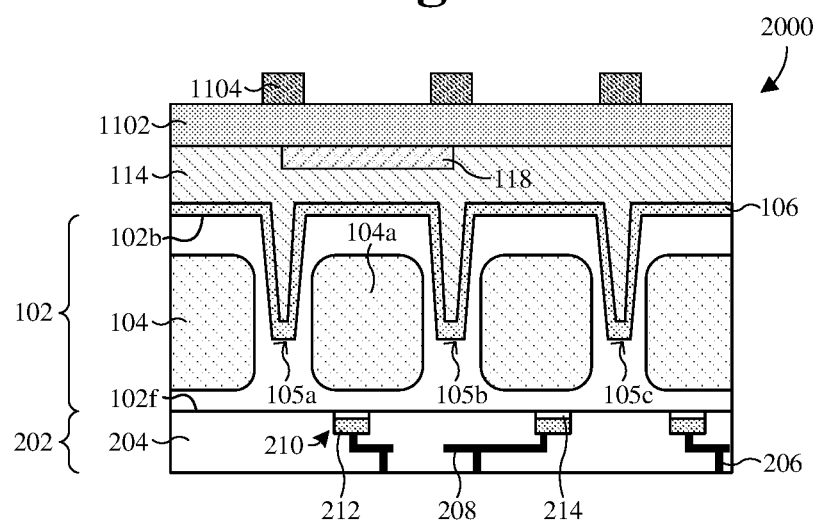

As illustrated in the cross-sectional view 2000 of FIG. 20, a composite grid layer 1102 is deposited over the buffer layer 114 and a masking layer 1104 is formed over the composite grid layer 1102. In some embodiments, the composite grid layer 1102 and the masking layer 1104 are substantially similar to the composite grid layer 1102 and the masking layer 1104 of FIG. 11. In further embodiments, the composite grid layer 1102 and the masking layer 1104 are formed by process(es) substantially similar to process(es) described above regarding the formation of the composite grid layer 1102 and the masking layer 1104 of FIG. 11.

Figure 21:
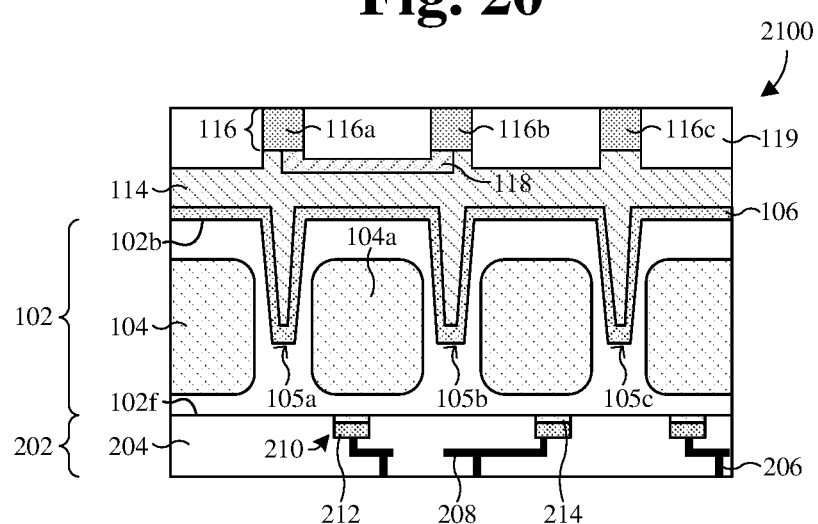

As illustrated in the cross-sectional view 2100 of FIG. 21, a patterning process is performed on the composite grid layer (1102 of FIG. 20) according to the masking layer (1104 of FIG. 20), thereby forming the composite grid structure 116. In some embodiments, the patterning process includes performing a dry etch process, a wet etch process, another suitable etch process, or any combination of the foregoing. In yet further embodiments, the patterning process may over-etch into the buffer layer 114 and the light shield structure 118, thereby removing at least a portion of the buffer layer 114 and the light shield structure 118. Further, a dielectric structure 119 is formed over the buffer layer 114 and the light shield structure 118. In some embodiments, the dielectric structure 119 may be formed by process(es) substantially similar to process(es) described above regarding the formation of the dielectric structure 119 of FIG. 13, such that a top surface of the dielectric structure 119 is coplanar with a top surface of the composite grid structure 116.

Figure 22:
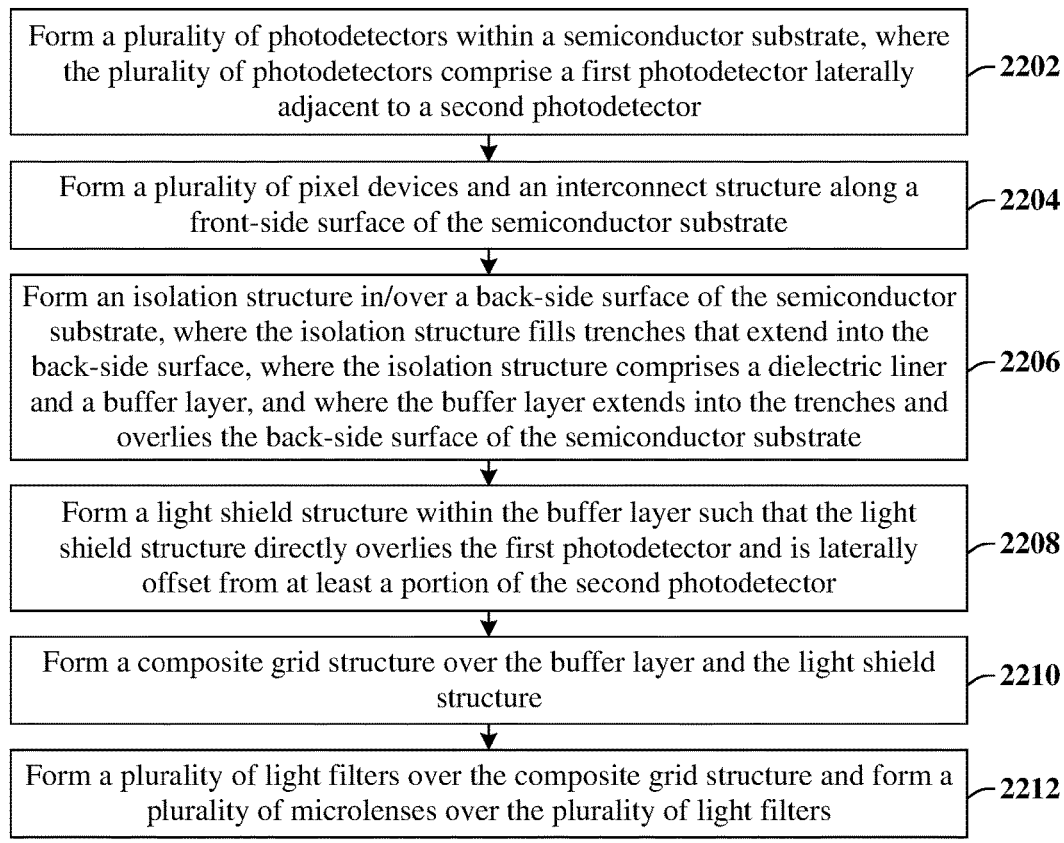
FIG. 22 illustrates a flow diagram of some embodiments of a method for forming an image sensor comprising a buffer layer disposed over a back-side surface of a semiconductor substrate and a light shield structure disposed within the buffer layer.

FIG. 22 illustrates a method 2200 for forming an image sensor comprising a buffer layer disposed over a back-side surface of a semiconductor substrate and a light shield structure embedded within the buffer layer according to the present disclosure. Although the method 2200 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2202, a plurality of photodetectors are formed within a semiconductor substrate. The plurality of photodetectors comprise a first photodetector laterally adjacent to a second photodetector. FIG. 5 illustrates a cross-sectional view 500 corresponding to some embodiments of act 2202.

At act 2204, a plurality of pixel devices and an interconnect structure are formed along a front-side surface of the semiconductor substrate. FIG. 6 illustrates a cross-sectional view 600 corresponding to some embodiments of act 2204.

At act 2206, an isolation structure is formed in/over a back-side surface of the semiconductor substrate, where the isolation structure fills trenches that extend into the back-side surface. The isolation structure comprises a dielectric liner and a buffer layer, where the buffer layer extends into the trenches and overlies the back-side surface of the semiconductor substrate. FIGS. 7 and 10 illustrate cross-sectional views 700 and 1000 corresponding to some embodiments of act 2206. Further, FIG. 16 illustrates a cross-sectional view 1600 corresponding to some alternative embodiments of act 2206.

At act 2208, a light shield structure is formed within the buffer layer such that the light shield structure directly overlies the first photodetector and is laterally offset from at least a portion of the second photodetector. FIGS. 8 and 9 illustrate cross-sectional views 800 and 900 corresponding to some embodiments of act 2208. Further, FIGS. 16-19 illustrate cross-sectional views 1600-1900 corresponding to some alternative embodiments of act 2208.

At act 2210, a composite grid structure is formed over the buffer layer and the light shield structure. FIGS. 11 and 12 illustrate cross-sectional views 1100 and 1200 corresponding to some embodiments of act 2210. Further, FIGS. 20 and 21 illustrate cross-sectional views 2000 and 2100 corresponding to some alternative embodiments of act 2210.

At act 2212, a plurality of light filters are formed over the composite grid structure and a plurality of microlenses are formed over the plurality of light filters. FIGS. 14 and 15 illustrate cross-sectional views 1400 and 1500 corresponding to some embodiments of act 2212.

Accordingly, in some embodiments, the present disclosure relates to an image sensor comprising a plurality of photodetectors disposed within a semiconductor substrate. A buffer layer is disposed over the plurality of photodetectors between a back-side surface of the semiconductor substrate and an overlying composite grid structure. A light shield structure is disposed within the buffer layer and directly overlies a corresponding photodetector.

In some embodiments, the present application provides an image sensor including a first photodetector disposed within a front-side surface of a semiconductor substrate; a trench isolation structure disposed over a back-side surface of the semiconductor substrate, wherein the trench isolation structure includes a buffer layer and a dielectric liner, wherein the buffer layer covers the back-side surface of the semiconductor substrate and fills trenches that extend downward into the back-side surface of the semiconductor substrate, wherein the dielectric liner is disposed between the buffer layer and the semiconductor substrate; a composite grid structure having composite grid segments that are aligned over the trenches, respectively, wherein the buffer layer separates the dielectric liner from the composite grid structure; and a light shield structure disposed within the buffer layer and directly overlying the first photodetector. In an embodiment, the light shield structure has a first end that terminates under a first composite grid segment of the composite grid structure and has a second end that terminates under a second composite grid segment of the composite grid structure, wherein the first composite grid segment neighbors the second composite grid segment. In an embodiments, the light shield structure has a top surface that is coplanar with a top surface of the buffer layer. In an embodiment, a first outer portion of the top surface of the light shield structure directly contacts a bottom surface of the first composite grid segment and wherein a second outer portion of the top surface of the light shield structure directly contacts a bottom surface of the second composite grid segment. In an embodiment, the light shield structure is embedded in the buffer layer, such that the buffer layer contacts a top surface of the light shield structure, contacts a lower surface of the light shield structure, and contacts sidewall surfaces of the light shield structure. In an embodiment, a first outer portion of the top surface of the light shield structure is spaced apart from a bottom surface of the first composite grid segment by the buffer layer, and wherein a second outer portion of the top surface of the light shield structure is spaced apart from a bottom surface of the second composite grid segment by the buffer layer. In an embodiment, the image sensor further includes a second photodetector disposed within the semiconductor substrate and neighboring the first photodetector; and wherein the light shield structure is laterally offset from at least a portion of the second photodetector by a non-zero distance. In an embodiment, a first outer portion of a lower surface of the light shield structure directly overlies a first outer edge of the second photodetector, and wherein the light shield structure is laterally offset from a second outer edge of the second photodetector by a non-zero distance in a direction towards the first photodetector.

In some embodiments, the present application provides an image sensor including a plurality of photodetectors disposed within a semiconductor substrate, wherein the plurality of photodetectors includes a first photodetector neighboring a second photodetector; an interconnect structure disposed along a front-side surface of the semiconductor substrate; an isolation structure disposed over a back-side surface of the semiconductor substrate, wherein the isolation structure includes a buffer layer that overlies the back-side surface of the semiconductor substrate and has one or more segments extending into a plurality of trenches that extend downward into the back-side surface of the semiconductor substrate; a metal grid structure disposed along a top surface of the buffer layer, wherein the buffer layer separates the metal grid structure from the back-side surface of the semiconductor substrate; and a light shield structure disposed within the buffer layer and directly overlying the first photodetector, wherein the light shield structure is laterally offset from at least a portion of the second photodetector, and wherein the light shield structure is configured to reduce a quantum efficiency (QE) of the first photodetector such that the QE of the first photodetector is less than a QE of the second photodetector. In an embodiment, a first outer sidewall of the light shield structure directly overlies a first trench of the plurality of trenches and a second outer sidewall of the light shield structure directly overlies a second trench of the plurality of trenches. In an embodiment, the image sensor further includes a dielectric structure overlying the buffer layer and disposed laterally between sidewalls of the metal grid structure; and wherein a top surface of the light shield structure is vertically above an upper surface of the light shield structure, wherein a top surface of the buffer layer is aligned with the top surface of the light shield structure, and wherein the dielectric structure extends continuously from sidewalls of the metal grid structure, along opposing sidewalls of the light shield structure, to the upper surface of the light shield structure. In an embodiment, the light shield structure comprises a first material and the buffer layer comprises a second material different than the second material. In an embodiment, the first material is titanium nitride, titanium oxide, or tantalum oxide, and the second material is silicon dioxide. In an embodiment, the plurality of photodetectors further includes a third photodetector such that the first photodetector is spaced laterally between the second and third photodetectors, wherein a first outer sidewall of the light shield structure directly overlies the third photodetector and a second outer sidewall of the light shield structure directly overlies the second photodetector, the first outer sidewall is opposite the second outer sidewall. In an embodiment, the light shield structure includes a first protrusion and a second protrusion, wherein the first protrusion has opposing sidewalls aligned with opposing sidewalls of a first grid segment of the metal grid structure and the second protrusion has opposing sidewalls aligned with opposing sidewalls of a second grid segment of the metal grid structure. In an embodiment, the light shield structure is spaced laterally between neighboring grid segments of the metal grid structure and a width of the light shield structure is less than a width of the first photodetector.

In some embodiments, the present application provides a method for forming an image sensor, the method including forming a plurality of photodetectors within a front-side surface of a semiconductor substrate; forming an isolation trench on a back-side surface of a semiconductor substrate, wherein the isolation trench laterally surrounds each photodetector; depositing a dielectric liner over the back-side surface of the semiconductor substrate such that the dielectric liner lines the isolation trench; forming a buffer layer to fill a remainder of the isolation trench and extend upward to a first height over the back-side surface of the semiconductor substrate; forming a light shield structure over the buffer layer such that the light shield structure directly overlies a first photodetector in the plurality of photodetectors; and forming a grid structure over the light shield structure such that the grid structure comprises a plurality of grid segments, wherein each photodetector is spaced laterally between neighboring grid segments. In an embodiment, the grid structure has a first grid segment aligned over a first outer edge of the light shield structure, and has a second grid segment aligned over a second outer edge of the light shield structure, the first outer edge being opposite the second outer edge. In an embodiment, forming the light shield structure includes forming a masking layer over the buffer layer, such that the masking layer comprises opposing sidewalls defining an opening directly above the first photodetector; patterning the buffer layer according to the masking layer, thereby forming a light shield opening within the buffer layer; depositing a light shield layer over the buffer layer such that the light shield layer fills the light shield opening; and performing a planarization process into the light shield layer, thereby forming a light shield structure directly over the first photodetector, wherein a top surface of the light shield structure is coplanar with a top surface of the buffer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, the method comprising:
   forming a plurality of photodetectors within a front-side surface of a semiconductor substrate;
   forming an isolation trench on a back-side surface of the semiconductor substrate, wherein the isolation trench laterally surrounds each photodetector;
   depositing a dielectric liner over the back-side surface of the semiconductor substrate such that the dielectric liner lines the isolation trench;
   forming a buffer layer to fill a remainder of the isolation trench and extend upward to a first height over the back-side surface of the semiconductor substrate;
   forming a light shield structure over the buffer layer such that the light shield structure directly overlies a first photodetector in the plurality of photodetectors, wherein the light shield structure comprises a dielectric material;
   forming a grid structure over the light shield structure such that the grid structure comprises a plurality of grid segments, wherein each photodetector is spaced laterally between neighboring grid segments; and
   depositing a dielectric structure between the plurality of grid segments, wherein the dielectric structure contacts opposing inner sidewalls of the light shield structure.

2. The method of claim 1, wherein the grid structure has a first grid segment aligned over a first outer edge of the light shield structure, and has a second grid segment aligned over a second outer edge of the light shield structure, the first outer edge being opposite the second outer edge.

3. The method of claim 1, wherein forming the light shield structure includes:
   forming a masking layer over the buffer layer, such that the masking layer comprises opposing sidewalls defining an opening directly above the first photodetector;
   patterning the buffer layer according to the masking layer, thereby forming a light shield opening within the buffer layer;
   depositing a light shield layer over the buffer layer such that the light shield layer fills the light shield opening; and
   performing a planarization process into the light shield layer, thereby forming the light shield structure directly over the first photodetector, wherein a top surface of the light shield structure is coplanar with a top surface of the buffer layer.

4. The method of claim 1, wherein a refractive index of the light shield structure is greater than a refractive index of the buffer layer.

5. The method of claim 1, wherein a ratio between a width of the light shield structure and a width of the first photodetector is at least 2:1.

6. The method of claim 1, wherein a height of the grid structure is greater than a height of the light shield structure.

7. The method of claim 1, wherein a distance between a bottom surface of the light shield structure and the back-side surface of the semiconductor substrate is between about 10 to 50,000 angstroms.

8. The method of claim 1, wherein the light shield structure comprises a top surface contacting a bottom surface of the grid structure and an upper surface vertically offset the bottom surface of the grid structure by a non-zero distance.

9. The method of claim 1, wherein a bottom surface the dielectric structure is disposed below a top surface of the light shield structure.

10. The method of claim 1, wherein the buffer layer contacts outer sidewalls of the light shield structure.

11. A method for forming an image sensor, the method comprising:
    forming a plurality of photodetectors within a substrate;
    forming a buffer layer over a back-side surface of the substrate;
    forming a light shield structure within the buffer layer, wherein the buffer layer directly contacts opposing sidewalls and a bottom surface of the light shield structure;
    depositing a composite grid layer over the buffer layer and the light shield structure; and
    performing a patterning process on the composite grid layer to form a grid structure over the buffer layer, wherein the grid structure comprises a first grid segment laterally offset from a second grid segment, wherein the light shield structure continuously laterally extends from under the first grid segment to under the second grid segment, wherein the light shield structure comprises protrusions and a lower body, and wherein the protrusions continuously vertically extend from the lower body to contact a bottom surface of the grid structure.

12. The method of claim 11, further comprising:
    forming a plurality of light filters over the grid structure, wherein the plurality of light filters comprises a first light filter directly overlying the light shield structure.

13. The method of claim 12, further comprising:
    forming a plurality of micro-lenses over the plurality of light filters, wherein the plurality of micro-lenses comprises a first micro-lens directly overlying the light shield structure.

14. The method of claim 11, wherein the grid structure comprises a metal material.

15. The method of claim 11, further comprising:
    forming a liner layer between the buffer layer and the substrate, wherein a thickness of the liner layer is less than a thickness of the light shield structure.

16. A method for forming an image sensor, the method comprising:
    forming a plurality of photodetectors within a substrate;
    forming an interconnect structure along a front-side surface of the substrate;
    patterning the substrate to form an isolation trench extending into a back-side surface of the substrate, wherein the isolation trench comprises a first trench segment laterally offset a second trench segment, wherein a first photodetector of the plurality of photodetectors is spaced laterally between the first and second trench segments;

forming an isolation structure in the isolation trench, wherein the isolation structure comprises a buffer layer extending vertically above the back-side surface;

forming an opening in the buffer layer;

depositing a light shield layer over the buffer layer and within the opening, wherein the light shield layer continuously laterally extends from over the first trench segment to over the second trench segment;

performing a planarization process on the light shield layer to define a light shield structure, wherein a top surface of the buffer layer is co-planar with a top surface of the light shield structure; and forming a grid structure over the buffer layer, wherein the light shield structure is disposed vertically between the back-side surface and the grid structure.

17. The method of claim 16, wherein the light shield structure is formed before forming the grid structure.

18. The method of claim 16, wherein the plurality of photodetectors comprises a second photodetector neighboring the first photodetector, wherein the light shield structure directly overlies the first photodetector and is laterally offset from the first photodetector by a non-zero distance.

19. The method of claim 16, wherein the top surface of the light shield structure directly contacts a bottom surface of the grid structure.

20. The method of claim 16, wherein a width of the light shield structure is greater than a width of an underlying photodetector.

* * * * *